US009123712B1

(12) United States Patent
Do et al.

(10) Patent No.: US 9,123,712 B1
(45) Date of Patent: Sep. 1, 2015

(54) LEADFRAME SYSTEM WITH WARP CONTROL MECHANISM AND METHOD OF MANUFACTURE THEREOF

(71) Applicants: Byung Tai Do, Singapore (SG); Arnel Senosa Trasporto, Singapore (SG); Linda Pei Ee Chua, Singapore (SG)

(72) Inventors: Byung Tai Do, Singapore (SG); Arnel Senosa Trasporto, Singapore (SG); Linda Pei Ee Chua, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 21 days.

(21) Appl. No.: 13/949,432

(22) Filed: Jul. 24, 2013

(51) Int. Cl.
*H01L 23/495* (2006.01)
*H01L 23/00* (2006.01)
*H01L 21/48* (2006.01)
*H01L 23/31* (2006.01)
*H01L 23/28* (2006.01)
*H05K 1/09* (2006.01)

(52) U.S. Cl.
CPC .......... *H01L 23/49565* (2013.01); *H01L 24/64* (2013.01); *H01L 21/4821* (2013.01); *H01L 23/28* (2013.01); *H01L 23/31* (2013.01); *H01L 23/3157* (2013.01); *H01L 23/495* (2013.01); *H01L 23/49541* (2013.01); *H01L 23/49548* (2013.01); *H01L 23/49582* (2013.01); *H01L 23/49586* (2013.01); *H05K 1/09* (2013.01)

(58) Field of Classification Search
CPC ............ H01L 23/495; H01L 23/49565; H01L 23/49541; H01L 23/49548; H01L 23/49582; H01L 23/49586; H01L 23/28; H01L 23/31; H01L 23/3157; H01L 21/4821; H05K 1/09
See application file for complete search history.

(56) References Cited

U.S. PATENT DOCUMENTS

| 5,053,852 | A | 10/1991 | Biswas et al. |
| 5,268,331 | A | 12/1993 | Abbott |
| 6,841,414 | B1* | 1/2005 | Hu et al. ........................ 438/106 |
| 7,968,981 | B2 | 6/2011 | Yee et al. |
| 8,203,199 | B2 | 6/2012 | Lee et al. |
| 8,338,922 | B1 | 12/2012 | Sirinorakul et al. |
| 2003/0006492 | A1* | 1/2003 | Ogasawara et al. ........... 257/684 |
| 2003/0071333 | A1* | 4/2003 | Matsuzawa ................... 257/676 |
| 2004/0046237 | A1* | 3/2004 | Abe et al. ...................... 257/676 |
| 2012/0280377 | A1* | 11/2012 | Do et al. ........................ 257/676 |

\* cited by examiner

*Primary Examiner* — Peniel M Gumedzoe
(74) *Attorney, Agent, or Firm* — Ishimaru & Associates LLP

(57) ABSTRACT

A leadframe system and method of manufacture includes: providing a leadframe having a side rail and a stabilizer, the side rail along a leadframe perimeter and the stabilizer within a rail inner perimeter of the side rail; forming a stabilizer plating layer directly on a bottom side of the stabilizer; and forming an encapsulation surrounded by a mold step, the mold step directly over the stabilizer and the stabilizer plating layer for forming a stiffening structure positioned within the rail inner perimeter of the side rail.

20 Claims, 10 Drawing Sheets

LEADFRAME SYSTEM WITH WARP CONTROL MECHANISM AND METHOD OF MANUFACTURE THEREOF

TECHNICAL FIELD

The present invention relates generally to a leadframe system, and more particularly to a leadframe system with a warp control mechanism.

BACKGROUND ART

Increased miniaturization of component packages, greater packaging density of integrated circuits ("ICs"), higher performance, and lower cost are ongoing goals of the electronics industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as smart phones, hands-free cellular phone headsets, camcorders, notebook computers, tablet computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Modern electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for integration and cost reduction.

Thus, a need still remains for a leadframe system providing integration, space savings, and low cost manufacturing. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of a leadframe system including: providing a leadframe having a side rail and a stabilizer, the side rail along a leadframe perimeter and the stabilizer within a rail inner perimeter of the side rail; forming a stabilizer plating layer directly on a bottom side of the stabilizer; and forming an encapsulation surrounded by a mold step, the mold step directly over the stabilizer for forming a stiffening structure positioned within the rail inner perimeter of the side rail.

The present invention provides a leadframe system, including: a leadframe having a leadframe perimeter; a side rail along the leadframe perimeter; a stabilizer within a rail inner perimeter of the side rail; a stabilizer plating layer directly on the bottom side of the stabilizer; and an encapsulation having a mold step surrounding the encapsulation, the mold step directly over the stabilizer for forming a stiffening structure positioned within the rail inner perimeter of the side rail.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
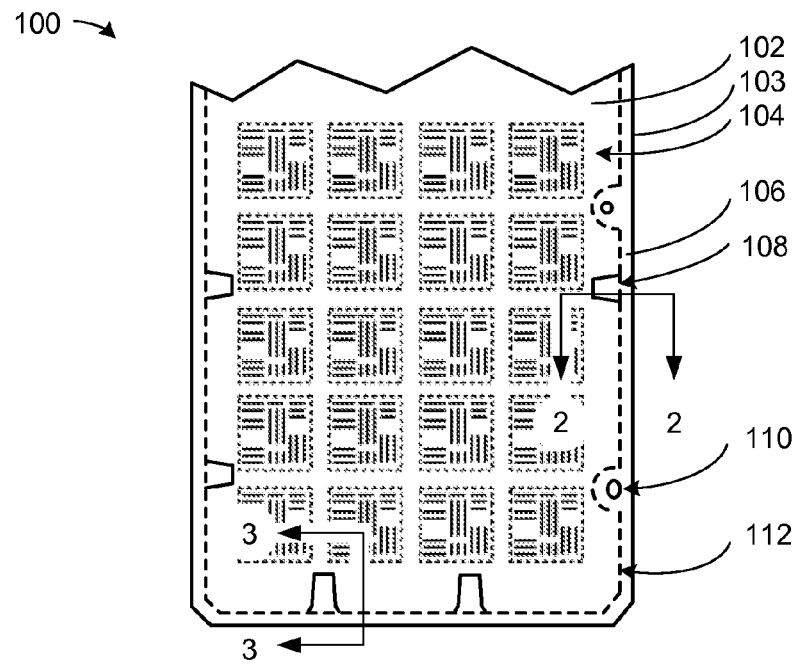
FIG. 1 is a bottom view of a portion of a leadframe system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a bottom view of a portion of a leadframe system 100 in an embodiment of the present invention. The leadframe system 100 can include a leadframe 102 having a redistribution layer 104 and a side rail 106. The leadframe system 100 can include a protection layer (not shown in FIG. 1) covering the redistribution layer 104.

The leadframe 102 is a conductive structural element. The leadframe 102 is the foundation structure of the leadframe system 100 and used to attach other elements.

The leadframe 102 can be formed from metal, alloy, or another conductive structural material. For example, the leadframe 102 can be formed from copper, copper alloy, or a combination thereof. In another example, the leadframe 102 can be a multi-layer structure having copper and copper alloy layers. The leadframe 102 can be shaped by pressing, stamping, etching, or a combination thereof.

The redistribution layer 104 is a conductive structure for forming conductive paths. The redistribution layer 104 can provide electrical signal paths to and from active and passive components attached to the leadframe system 100. The redistribution layer 104 can include traces, pads, vias, or a combination thereof. The redistribution layer 104 can be formed directly on the leadframe 102. Although the redistribution layer 104 is shown as having a regular pattern, it is understood that the redistribution layer 104 can have a variety of configurations for providing electrical interconnections between elements.

The side rail 106 is a structural element located around the perimeter of the leadframe 102. The side rail 106 can surrounding the redistribution layer 104. The side rail 106 can be formed from a portion of the leadframe 102. The side rail 106 can provide structural stabilization to reduce warpage of the leadframe 102 during manufacturing.

The side rail 106 can have a width to minimize the amount of material used to form the side rail 106. The side rail 106 can be formed from nickel, palladium, gold, or a combination thereof.

The side rail 106 can be formed in a variety of sizes. In an illustrative example, the side rail 106 can have a range from 70×255 mm to 100×300 mm.

The leadframe system 100 can include a stabilizer 108 directly on the side rail 106. The stabilizer 108 can be a stabilizer tab, a stabilizer bar, or a combination thereof. The stabilizer 108 is a structural element for stiffening the leadframe system 100. The stabilizer 108 can be formed from a portion of the leadframe 102. For example, the stabilizer 108 can be a stabilizer tab formed from a portion of the leadframe 102 that has not been etched.

The stabilizer 108 can extend inward from the side rail 106 toward the redistribution layer 104. The stabilizer 108 can extend along a portion of the side rail 106. For example, the stabilizer 108 can be a stabilizer tab approximately as long as the stabilizer tab extends inward.

The stabilizer 108 can be formed in a variety of shapes. For example, the stabilizer 108 can be a stabilizer tab having approximately the same width and length. In another example, the stabilizer 108 can be square, trapezoidal, a rounded rectangle shape, or a combination thereof.

The leadframe system 100 can include a rail mounting opening 110. The rail mounting opening 110 is an opening through the leadframe 102 for attaching the leadframe system 100 to an external system (not shown).

The rail mounting opening 110 is positioned between the side rail 106 and the redistribution layer 104. The rail mounting opening 110 can be positioned at regular intervals around the side rail 106 for uniform fastening.

The leadframe system 100 can include an encapsulation 112 as indicated by the phantom dashed line in FIG. 1. The encapsulation 112 is a protective layer on the top side of the leadframe system 100. The encapsulation 112 can include a notch around the rail mounting opening 110. The position of the encapsulation 112 is indicated by the phantom line around a leadframe perimeter 103 of the leadframe system 100.

The stabilizer 108 can span from the side rail 106 to over a portion of the encapsulation 112. The stabilizer 108 can reduce the warpage of the leadframe system 100 by providing additional stiffness to the leadframe system 100 during heating operations such as reflow operations.

It has been discovered that forming the stabilizer 108 at the side rail 106 simplifies manufacturing. The stabilizer 108 allows the side rail 106 to have a reduced width to limit the amount material needed to form the side rail 106 and to reduce warpage from the side rail 106.

It has been discovered that forming the stabilizer 108 at the side rail 106 increases reliability and increases manufacturing yield. The stabilizer 108 provides additional stiffness to the leadframe system 100 and reduces the amount of warpage of the leadframe system 100 to prevent defects caused by excessive warpage.

Figure 2:
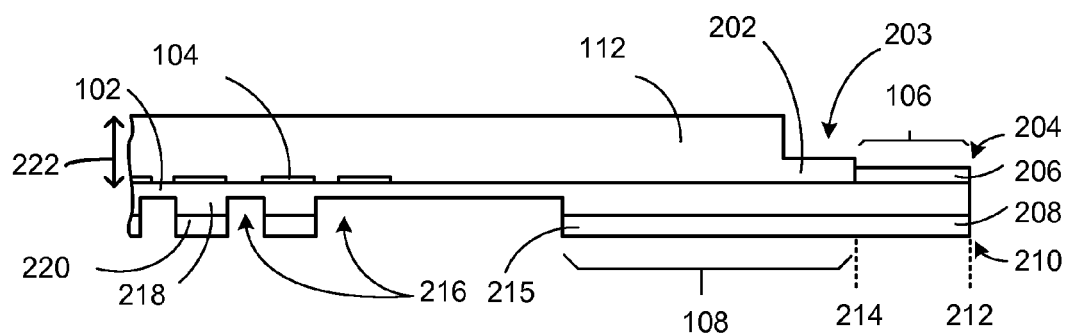
FIG. 2 is an exemplary side view of a portion of the leadframe system along a line 2-2 of FIG. 1.

Referring now to FIG. 2, therein is shown an exemplary side view of a portion of the leadframe system 100 of FIG. 1 along a line 2-2 of FIG. 1. The leadframe system 100 can include the leadframe 102, the redistribution layer 104, the encapsulation 112, a mold step 202, and the side rail 106.

The leadframe 102 is a metal structural element. The leadframe 102 can be formed from metal, alloy, or another conductive structural material. For example, the leadframe 102 can be formed from copper.

The redistribution layer 104 is a conductive structure for forming conductive paths. The redistribution layer 104 can include traces, pads, vias, or a combination thereof. The redistribution layer 104 can be formed directly on a portion of the leadframe 102.

The redistribution layer 104 can be formed directly on the leadframe 102. For example, the traces of the redistribution layer 104 can be formed by etching a planar layer of conductive material formed directly on top of the leadframe 102.

The leadframe system 100 can include the encapsulation 112. The encapsulation 112 is a non-conductive layer for protecting underlying elements. The encapsulation 112 can be formed directly on the leadframe 102 and the redistribution layer 104. For example, the encapsulation 112 can be formed with an encapsulation molding compound.

The encapsulation 112 can be formed directly on and over the redistribution layer 104. The encapsulation 112 can encapsulate the redistribution layer 104 and expose the redistribution layer 104 to the leadframe 102. The encapsulation 112 can have an encapsulation height 222.

The leadframe system 100 can include the mold step 202. The mold step is a lowered structural element extending outward from the encapsulation 112. The mold step 202 can be formed from the encapsulation molding compound. The mold step 202 can be between the encapsulation 112 and the side rail 106. The mold step 202 can add stiffness to the integrated packaging system by extending the encapsulation 112 to the edge of the side rail 106. The extent of the encapsulation 112 and the mold step 202 can be shown by dashed line in FIG. 1.

The leadframe system 100 can include the side rail 106. The side rail 106 is a structural element located around the leadframe perimeter 103 of the leadframe 102. The side rail 106 can be formed from a portion of the leadframe 102.

The side rail 106 can include a top rail coating 206 and a bottom rail coating 208. The top rail coating 206 and the bottom rail coating 208 are conductive structures formed on the leadframe 102. The top rail coating 206 and the bottom rail coating 208 are thinner than the thickness of the mold step 202.

The top rail coating 206 and the bottom rail coating 208 can be metal, alloy, or a combination thereof. Although the top rail coating 206 and the bottom rail coating 208 are shown as a single layer, it is understood that the top rail coating 206 and the bottom rail coating 208 can be multi-layer structures.

The top rail coating 206 and the bottom rail coating 208 can be formed from an etch resistant material. For example, portions of the leadframe 102 having the top rail coating 206 and the bottom rail coating 208 can be protected from etching.

The top rail coating 206 is on the same side of the leadframe system 100 as the encapsulation 112. The bottom rail coating 208 is on the side opposite from the encapsulation 112.

The side rail 106 can include a rail top side 204 and a rail bottom side 210. The rail top side 204 is on the same side as the encapsulation 112 and the top rail coating 206. The rail bottom side 210 is on the opposite side from the rail top side 204 and on the same side as the bottom rail coating 208.

The side rail 106 can have a rail outer perimeter 212 and a rail inner perimeter 214. The rail inner perimeter 214 is at the mold step 202. The rail outer perimeter 212 is on the opposite side of the rail as the rail inner perimeter 214.

The leadframe system 100 can include vertical interconnects 218. The vertical interconnects 218 are electrically conductive structures. The vertical interconnects 218 can be electrically connected to the redistribution layer 104.

The vertical interconnects 218 can include an interconnect coating layer 220. The interconnect coating layer 220 is a conductive protection layer on the bottom side of the vertical interconnect 218. The interconnect coating layer 220 can be formed from a metal, an alloy, or a combination thereof.

The interconnect coating layer 220 can be an etch resistant material. For example, portions of the leadframe 102 having the interconnect coating layer 220 can be protected from etching.

The leadframe 102 can include a half-etched area 216. The half-etched area 216 is a portion of the leadframe 102 that has been partially etched to remove a portion of the leadframe 102 while exposing a lowered portion of the leadframe 102. For example, the half-etched area 216 can be between the vertical interconnects 218 and the side rail 106. In another example, the half-etched area 216 can be between one of the vertical interconnects 218 and another of the vertical interconnects 218.

The leadframe system 100 can include the stabilizer 108, such as a stabilizer tab, a stiffener, or a combination thereof. The stabilizer 108 can be directly on the side rail 106 and directly below the mold step 202.

The stabilizer 108 is a structural element for stiffening the leadframe system 100. For example, the stabilizer 108 can be a stabilizer tab formed from a portion of the leadframe 102 that has not been etched.

The stabilizer 108 can extend inward from the side rail 106 toward the redistribution layer 104. The stabilizer 108 can extend along a portion of the side rail 106 about as long as the stabilizer 108 extends inward.

The stabilizer tab can be formed in a variety of shapes but is approximately the same width and length. For example, the stabilizer tab can be square, trapezoidal, a rounded rectangle shape, or a combination thereof.

The stabilizer tab can span from the side rail 106, over the mold step 202, and over a portion of the encapsulation 112. The stabilizer 108 can reduce the warpage of the leadframe system 100 by providing additional stiffness to the leadframe system 100 during heating operations such as reflow operations.

The stabilizer 108 and the side rail 106 can be combined to increase the stiffness of the leadframe system 100. The stabilizer 108 can couple together with the stabilizer 108 to distribute mechanical stress and reduce warpage during manufacture.

The stabilizer 108, the side rail 106, and the mold step 202 can combine to increase the stiffness of the leadframe system 100. Forming the mold step 202 over a portion of the stabilizer 108 and directly on the side of the side rail 106 can coupled can distribute mechanical stress across the leadframe system 100 and reduce warpage during manufacture.

The stabilizer 108 can include a stabilizer plating layer 215. The stabilizer plating layer 215 is a conductive coating on the bottom side of the stabilizer 108. The stabilizer plating layer 215 can be formed from meal, alloy, or a combination thereof. For example, the stabilizer plating layer 215 can be formed with copper, gold, tin, or a combination thereof.

The stabilizer 108 and the mold step 202 can form a stiffening structure 203 to reduce warpage of the leadframe system 100. The stiffening structure 203 is a layered structural element. The stiffening structure 203 can include multiple layers for resisting mechanical stress and reducing warpage. The stiffening structure 203 can also include the stabilizer plating layer 215, the encapsulation 112, or a combination thereof.

It has been discovered that forming the stiffening structure 203 with the mold step 202 and the stabilizer 108 increases reliability and increases manufacturing yield by reducing the amount of warpage during the manufacturing of the leadframe system 100. The stiffening structure 203 provides a layered structure for reducing warpage by allowing the dissipation of mechanical stress and providing rigidity to the leadframe system 100.

It has been discovered that forming the top rail coating 206 and the bottom rail coating 208 increases reliability and increases manufacturing yield by reducing the amount of warpage due to the side rail 106 during heating. The top rail coating 206 and the bottom rail coating 208 on the side rail 106 increase the stiffness of the side rail 106, allowing the side rail 106 to be thinner to reduce the amount of warpage due to the side rail 106.

It has been discovered that forming the mold step 202 between the encapsulation 112 and the side rail 106 increases reliability by reducing warpage of the leadframe 102. Because the mold step 202 deforms less than the side rail 106 when heated, the mold step 202 reduces the degree of warpage caused by heating the side rail 106 during reflow operations.

It has been discovered that forming the encapsulation 112 and the mold step 202 increases reliability and reduces complexity by forming the mold step 202 as part of the encapsulation 112. By forming the encapsulation 112 and the mold step 202 in one operation, the degree of warpage caused by heating the side rail 106 during reflow operations can be reduced with fewer manufacturing steps.

Figure 3:
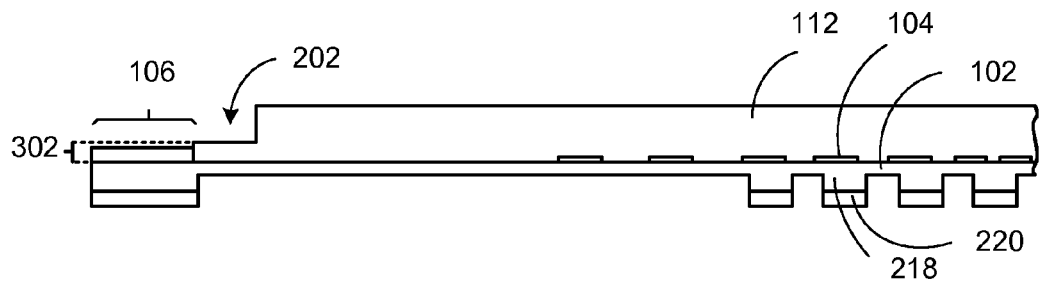
FIG. 3 is an exemplary side view of a portion of the leadframe system along a line 3-3 of FIG. 1.

Referring now to FIG. 3, therein is shown an exemplary side view of a portion of the leadframe system 100 of FIG. 1 along a line 3-3 of FIG. 1. The leadframe system 100 can include the leadframe 102, the redistribution layer 104, the encapsulation 112, the mold step 202, and the side rail 106.

The leadframe 102 is a metal structural element. The leadframe 102 can be formed from metal, alloy, or another conductive structural material. For example, the leadframe 102 can be formed from copper.

The redistribution layer 104 is a conductive structure for forming conductive paths. The redistribution layer 104 can include traces, pads, vias, or a combination thereof. The redistribution layer 104 can be formed directly on a portion of the leadframe 102.

The redistribution layer 104 can be formed directly on the leadframe 102. For example, the traces of the redistribution layer 104 can be formed by etching a planar layer of conductive material formed directly on top of the leadframe 102.

The encapsulation 112 can be formed directly on the leadframe 102 and the redistribution layer 104. The encapsulation 112 is a non-conductive layer for protecting underlying elements. For example, the encapsulation 112 can be formed with an encapsulation molding compound.

The leadframe system 100 can include the mold step 202. The mold step is a lowered structural element extending outward from the encapsulation 112. The mold step 202 can be formed from the encapsulation molding compound. The mold step 202 can be between the encapsulation 112 and the side rail 106. The mold step 202 can add stiffness to the integrated packaging system by extending the encapsulation 112 to the edge of the side rail 106. The mold step 202 can have a mold step height 302. The mold step height 302 is less than then the encapsulation height 222 of FIG. 2.

The side rail 106 can include the top rail coating 206 of FIG. 2 and the bottom rail coating 208 of FIG. 2. The top rail coating 206 and the bottom rail coating 208 are conductive structures formed on the leadframe 102. The top rail coating 206 and the bottom rail coating 208 are thinner than the thickness of the mold step 202.

The top rail coating 206 and the bottom rail coating 208 can be metal, alloy, or a combination thereof. Although the top rail coating 206 and the bottom rail coating 208 are shown as a single layer, it is understood that the top rail coating 206 and the bottom rail coating 208 can be multi-layer structures.

The top rail coating 206 and the bottom rail coating 208 can be formed from an etch resistant material. For example, portions of the leadframe 102 having the top rail coating 206 and the bottom rail coating 208 can be protected from etching.

The top rail coating 206 is on the same side of the leadframe system 100 as the encapsulation 112. The bottom rail coating 208 is on the side opposite of the leadframe system 100 from the encapsulation 112.

The side rail 106 can include the rail top side 204 of FIG. 2 and the rail bottom side 210 of FIG. 2. The rail top side 204 is on the same side as the encapsulation 112 and the top rail coating 206. The rail bottom side 210 is on the opposite side from the rail top side 204 and on the same side as the bottom rail coating 208.

The leadframe system 100 can include the side rail 106. The side rail 106 is a structural element located around the leadframe perimeter 103 of the leadframe 102. The side rail 106 can be formed from a portion of the leadframe 102.

The leadframe system 100 can include the vertical interconnects 218 of FIG. 2. The vertical interconnects 218 are electrically conductive structures. The vertical interconnects 218 can be electrically connected to the redistribution layer 104.

The vertical interconnects 218 can include the interconnect coating layer 220 of FIG. 2. The interconnect coating layer 220 is a conductive protection layer on the bottom side of the vertical interconnect 218. The interconnect coating layer 220 can be formed from a metal, an alloy, or a combination thereof.

The interconnect coating layer 220 can be an etch resistant material. For example, portions of the leadframe 102 having the interconnect coating layer 220 can be protected from etching.

It has been discovered that forming the stiffening structure 203 of FIG. 2 with the mold step 202 and the stabilizer 108 of FIG. 1 increases reliability and increases manufacturing yield by reducing the amount of warpage during the manufacturing of the leadframe system 100. The stiffening structure 203 provides a layered structure for reducing warpage by allowing the dissipation of mechanical stress and providing rigidity to the leadframe system 100.

It has been discovered that forming the top rail coating 206 and the bottom rail coating 208 increases reliability and increases manufacturing yield by reducing the amount of warpage due to the side rail 106 during heating. The top rail coating 206 and the bottom rail coating 208 on the side rail 106 increase the stiffness of the side rail 106, allowing the side rail 106 to be thinner to reduce the amount of warpage due to the side rail 106.

It has been discovered that forming the mold step 202 between the encapsulation 112 and the side rail 106 increases reliability by reducing warpage of the leadframe 102. Because the mold step 202 deforms less than the side rail 106 when heated, the mold step 202 reduces the degree of warpage caused by heating the side rail 106 during reflow operations.

It has been discovered that forming the encapsulation 112 and the mold step 202 increases reliability and reduces complexity by forming the mold step 202 as part of the encapsulation 112. By forming the encapsulation 112 and the mold step 202 in one operation, the degree of warpage caused by heating the side rail 106 during reflow operations can be reduced with fewer manufacturing steps.

Figure 4:
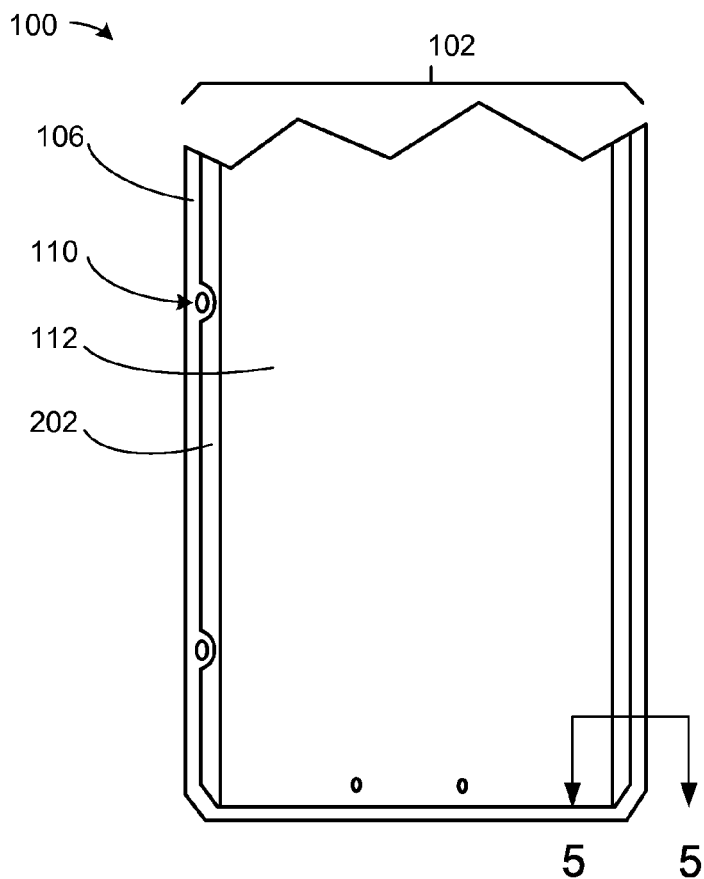
FIG. 4 is an exemplary top diagram of the leadframe system.

Referring now to FIG. 4, therein is shown an exemplary top diagram of the leadframe system 100. The leadframe 102 of FIG. 1 can include the encapsulation 112, the mold step 202, and the side rail 106.

The encapsulation 112 can be formed directly on the leadframe 102. The encapsulation 112 is thicker than the mold step 202. The encapsulation 112 can extend substantially across the leadframe 102.

The encapsulation 112 can include the mold step 202. The mold step 202 is formed from the encapsulation molding compound and forms a step in height between the main body of the encapsulation 112 and the side rail 106. The mold step 202 can surround ng portion of the encapsulation 112. The mold step 202 is positioned between the encapsulation 112 and the side rail 106.

The side rail 106 surrounds the encapsulation 112 and the mold step 202. The side rail 106 can provide stability while forming the leadframe system 100.

The side rail 106 can include the rail mounting opening 110. The rail mounting opening 110 is a hole in the side rail 106. The rail mounting opening 110 can act as an alignment guide during the molding process. For example, the guide pin of the mold chase used to form the encapsulation 112 can be positioned in the rail mounting opening 110 to prevent mold bleed from the encapsulation molding compound leaking into the rail mounting opening 110.

The mold step 202 can include a notch around the rail mounting opening 110. The rail mounting opening 110 can be positioned at regular intervals around the side rail 106 for uniform fastening to an external system (not shown).

Figure 5:
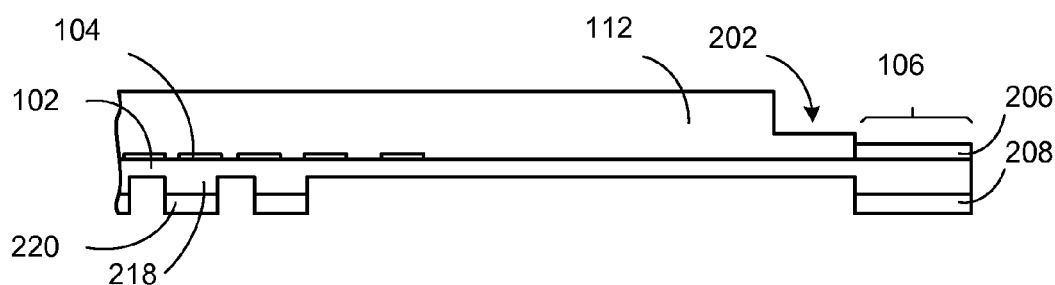
FIG. 5 is an exemplary side view of a portion of the leadframe system along a line 5-5 of FIG. 4.

Referring now to FIG. 5, therein is shown an exemplary side view of a portion of the leadframe system 100 of FIG. 4 along a line 5-5 of FIG. 4. The leadframe system 100 can include the leadframe 102, the encapsulation 112, the mold step 202, and the side rail 106.

The leadframe 102 is a metal structural element. The leadframe 102 can be formed from metal, alloy, or another conductive structural material. For example, the leadframe 102 can be formed from copper.

The redistribution layer 104 is a conductive structure for forming conductive paths. The redistribution layer 104 can include traces, pads, vias, or a combination thereof. The redistribution layer 104 can be formed directly on a portion of the leadframe 102.

The redistribution layer 104 can be formed directly on the leadframe 102. For example, the traces of the redistribution layer 104 can be formed by etching a planar layer of conductive material formed directly on top of the leadframe 102.

The encapsulation 112 can be formed directly on the leadframe 102 and the redistribution layer 104. The encapsulation 112 is a non-conductive layer for protecting underlying elements. For example, the encapsulation 112 can be formed with an encapsulation molding compound.

The leadframe system 100 can include the mold step 202. The mold step is a lowered structural element extending outward from the encapsulation 112. The mold step 202 can be formed from the encapsulation molding compound. The mold step 202 can be between the encapsulation 112 and the side rail 106. The mold step 202 can add stiffness to the integrated packaging system by extending the encapsulation 112 to the edge of the side rail 106.

The leadframe system 100 can include the side rail 106. The side rail 106 is a structural element located around the perimeter of the leadframe 102. The side rail 106 can be formed from a portion of the leadframe 102.

The side rail 106 can include the top rail coating 206 and the bottom rail coating 208. The top rail coating 206 and the bottom rail coating 208 are conductive structures formed on the leadframe 102. The top rail coating 206 and the bottom rail coating 208 are thinner than the thickness of the mold step 202.

The top rail coating 206 and the bottom rail coating 208 can be metal, alloy, or a combination thereof. Although the top rail coating 206 and the bottom rail coating 208 are shown as a single layer, it is understood that the top rail coating 206 and the bottom rail coating 208 can be multi-layer structures.

The top rail coating 206 and the bottom rail coating 208 can be formed from an etch resistant material. For example, portions of the leadframe 102 having the top rail coating 206 and the bottom rail coating 208 can be protected from etching.

The top rail coating 206 is on the same side of the leadframe system 100 as the encapsulation 112. The bottom rail coating 208 is on the side opposite of the leadframe system 100 from the encapsulation 112.

The side rail 106 can include the rail top side 204 of FIG. 2 and the rail bottom side 210 of FIG. 2. The rail top side 204 is on the same side as the encapsulation 112 and the top rail coating 206. The rail bottom side 210 is on the opposite side from the rail top side 204 and on the same side as the bottom rail coating 208.

The leadframe system 100 can include the vertical interconnects 218. The vertical interconnects 218 are electrically conductive structures. The vertical interconnects 218 can be electrically connected to the redistribution layer 104.

The vertical interconnects 218 can include the interconnect coating layer 220. The interconnect coating layer 220 is a conductive protection layer on the bottom side of the vertical interconnect 218. The interconnect coating layer 220 can be formed from a metal, an alloy, or a combination thereof.

The interconnect coating layer 220 can be an etch resistant material. For example, portions of the leadframe 102 having the interconnect coating layer 220 can be protected from etching.

It has been discovered that forming the stiffening structure 203 of FIG. 2 with the mold step 202 and the stabilizer 108 of FIG. 1 increases reliability and increases manufacturing yield by reducing the amount of warpage during the manufacturing of the leadframe system 100. The stiffening structure 203 provides a layered structure for reducing warpage by allowing the dissipation of mechanical stress and providing rigidity to the leadframe system 100.

It has been discovered that forming the top rail coating 206 and the bottom rail coating 208 increases reliability and increases manufacturing yield by reducing the amount of warpage due to the side rail 106 during heating. The top rail coating 206 and the bottom rail coating 208 on the side rail 106 increase the stiffness of the side rail 106, allowing the side rail 106 to be thinner to reduce the amount of warpage due to the side rail 106.

It has been discovered that forming the mold step 202 between the encapsulation 112 and the side rail 106 increases reliability by reducing warpage of the leadframe 102. Because the mold step 202 deforms less than the side rail 106 when heated, the mold step 202 reduces the degree of warpage caused by heating the side rail 106 during reflow operations.

It has been discovered that forming the encapsulation 112 and the mold step 202 increases reliability and reduces complexity by forming the mold step 202 as part of the encapsulation 112. By forming the encapsulation 112 and the mold step 202 in one operation, the degree of warpage caused by heating the side rail 106 during reflow operations can be reduced with fewer manufacturing steps.

Figure 6:
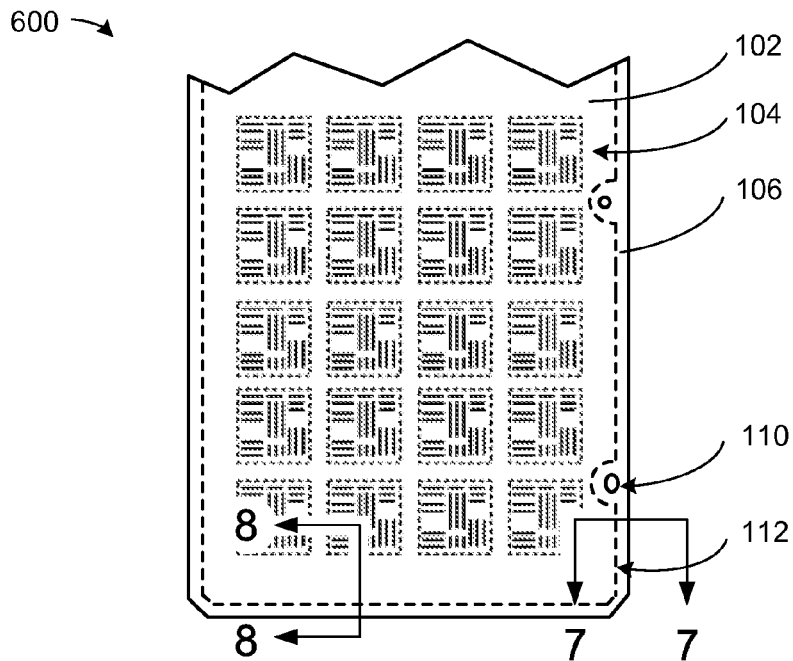
FIG. 6 is a bottom view of a portion of a leadframe system in a second embodiment of the present invention.

Referring now to FIG. 6, therein is shown a bottom view of a portion of a leadframe system 600 in a second embodiment of the present invention. The leadframe system 600 can include the leadframe 102 having the redistribution layer 104 and the side rail 106.

The leadframe system 600 is substantially similar to the leadframe system 100. The leadframe system 600 can include the stabilizer 108 of FIG. 1 configured as the stabilizer bar instead of the stabilizer tab. The leadframe system 100 can include a trace protection layer (not shown in FIG. 6) covering the bottom side of the redistribution layer 104.

The leadframe 102 is a conductive structural element. The leadframe 102 is the foundation structure of the leadframe system 100 and used to attach other elements.

The leadframe 102 can be formed from metal, alloy, or another conductive structural material. For example, the leadframe 102 can be formed from copper. In another example, the leadframe 102 can be a multi-layer structure having copper and copper alloy layers. The leadframe 102 can be shaped by pressing, stamping, etching, or a combination thereof.

The redistribution layer 104 is a conductive structure for forming conductive paths. The redistribution layer 104 can provide electrical signal paths to and from active and passive components attached to the leadframe system 100. The redistribution layer 104 can include traces, pads, vias, or a combination thereof. The redistribution layer 104 can be formed directly on the leadframe 102. Although the redistribution layer 104 is shown as having a regular pattern, it is understood that the redistribution layer 104 can have a variety of configurations for providing electrical interconnections between elements.

The side rail 106 is a structural element located around the perimeter of the leadframe 102. The side rail 106 can surrounding the redistribution layer 104. The side rail 106 can be formed from a portion of the leadframe 102. The side rail 106 can provide structural stabilization to reduce warpage of the leadframe 102 during manufacturing.

The side rail 106 can have a width to minimize the amount of material used to form the side rail 106. For example, the side rail 106 can have a range of widths.

The leadframe system 100 can include the stabilizer 108 directly on the side rail 106. The stabilizer 108 can be a stabilizer bar. The stabilizer 108 is a structural element for stiffening the leadframe system 100. The stabilizer 108 can be formed from a portion of the leadframe 102. For example, the stabilizer 108 can be a stabilizer bar formed from a portion of the leadframe 102 that has not been etched.

The stabilizer 108 can extend inward from the side rail 106 toward the redistribution layer 104. The stabilizer 108 can extend along the side rail 106. For example, the stabilizer 108 can be a stabilizer bar approximately as long as one side of the side rail 106

The leadframe system 600 can include the rail mounting opening 110. The rail mounting opening 110 is an opening through the leadframe 102 for attaching the leadframe system 600 to an external system (not shown).

The rail mounting opening 110 can be positioned between the side rail 106 and the redistribution layer 104. The rail mounting opening 110 can be positioned at regular intervals around the side rail 106 for uniform fastening.

The leadframe system 600 can include the encapsulation 112 as indicated by the phantom dashed line in FIG. 1. The encapsulation 112 is a protective layer on the top side of the leadframe system 600. The encapsulation 112 can include a notch around the rail mounting opening 110. The position of the encapsulation 112 is indicated by the phantom line around the perimeter of the leadframe system 600.

It has been discovered that forming the stabilizer 108 at the side rail 106 increases reliability and increases manufacturing yield. The stabilizer 108 provides additional stiffness to the leadframe system 100 and reduces the amount of warpage of the leadframe system 100 to prevent defects caused by excessive warpage.

Figure 7:
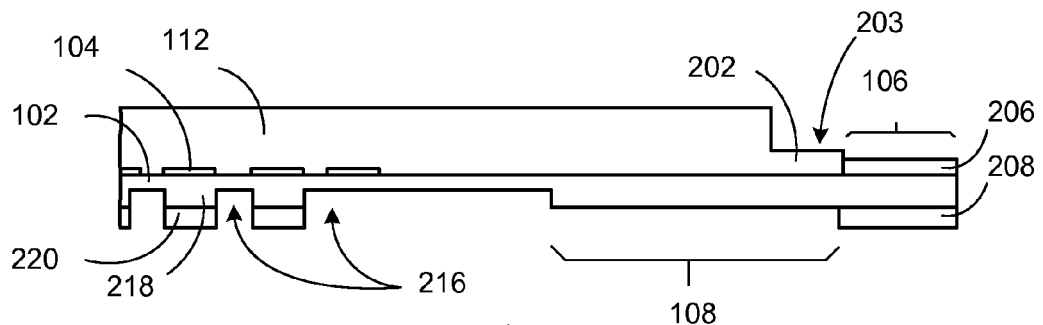
FIG. 7 is an exemplary side view of a portion of the leadframe system along a line 7-7 of FIG. 6.

Referring now to FIG. 7, therein is shown an exemplary side view of a portion of the leadframe system 100 of FIG. 6 along a line 7-7 of FIG. 6. The leadframe system 100 can include the leadframe 102, the redistribution layer 104, the encapsulation 112, the mold step 202, and the side rail 106.

The leadframe 102 is a metallic structural element for forming an integrated circuit packaging system. The leadframe 102 can be formed from metal, alloy, or another conductive structural material. For example, the leadframe 102 can be formed from copper.

The redistribution layer 104 is a conductive structure for forming conductive paths. The redistribution layer 104 can include traces, pads, vias, or a combination thereof. The redistribution layer 104 can be formed directly on a portion of the leadframe 102.

The redistribution layer 104 can be formed directly on the leadframe 102. For example, the traces of the redistribution layer 104 can be formed by etching a planar layer of conductive material formed directly on top of the leadframe 102.

The encapsulation 112 can be formed directly on the leadframe 102 and the redistribution layer 104. The encapsulation 112 is a non-conductive layer for protecting underlying elements. For example, the encapsulation 112 can be formed with an encapsulation molding compound.

The encapsulation 112 can be formed directly on and over the redistribution layer 104. The encapsulation 112 can encapsulate the redistribution layer 104 and expose the redistribution layer 104 to the leadframe 102.

The leadframe system 100 can include the mold step 202. The mold step is a lowered structural element extending outward from the encapsulation 112. The mold step 202 can be formed from the encapsulation molding compound. The mold step 202 can be between the encapsulation 112 and the side rail 106. The mold step 202 can add stiffness to the integrated packaging system by extending the encapsulation 112 to the edge of the side rail 106.

The leadframe system 100 can include the side rail 106. The side rail 106 is a structural element located around the perimeter of the leadframe 102. The side rail 106 can be formed from a portion of the leadframe 102.

The side rail 106 can include the top rail coating 206 and the bottom rail coating 208. The top rail coating 206 and the bottom rail coating 208 are conductive structures formed on the leadframe 102. The top rail coating 206 and the bottom rail coating 208 are thinner than the thickness of the mold step 202.

The top rail coating 206 and the bottom rail coating 208 can be metal, alloy, or a combination thereof. Although the top rail coating 206 and the bottom rail coating 208 are shown as a single layer, it is understood that the top rail coating 206 and the bottom rail coating 208 can be multi-layer structures.

The top rail coating 206 and the bottom rail coating 208 can be formed from an etch resistant material. For example, portions of the leadframe 102 having the top rail coating 206 and the bottom rail coating 208 can be protected from etching.

The top rail coating 206 is on the same side of the leadframe system 100 as the encapsulation 112. The bottom rail coating 208 is on the side opposite from the encapsulation 112.

The side rail 106 can include the rail top side 204 of FIG. 2 and the rail bottom side 210 of FIG. 2. The rail top side 204 is on the same side as the encapsulation 112 and the top rail coating 206. The rail bottom side 210 is on the opposite side from the rail top side 204 and on the same side as the bottom rail coating 208.

The leadframe system 100 can include the vertical interconnects 218. The vertical interconnects 218 are electrically conductive structures. The vertical interconnects 218 can be electrically connected to the redistribution layer 104.

The vertical interconnects 218 can include the interconnect coating layer 220. The interconnect coating layer 220 is a conductive protection layer on the bottom side of the vertical interconnect 218. The interconnect coating layer 220 can be formed from a metal, an alloy, or a combination thereof.

The interconnect coating layer 220 can be an etch resistant material. For example, portions of the leadframe 102 having the interconnect coating layer 220 can be protected from etching.

The leadframe 102 can include the half-etched area 216. The half-etched area 216 is a portion of the leadframe 102 that has been partially etched to remove a portion of the leadframe 102 while exposing a lowered portion of the leadframe 102. For example, the half-etched area 216 can be between the vertical interconnects 218 and the side rail 106. In another example, the half-etched area 216 can be between one of the vertical interconnects 218 and another of the vertical interconnects 218.

The leadframe system 100 can include the stabilizer 108, such as a stabilizer bar, a stiffener, or a combination thereof. The stabilizer bar is a structural element for increasing the stiffness of the leadframe system 100.

The stabilizer bar can be positioned around the redistribution layer 104 and between the redistribution layer 104 and the side rail 106. For example, the stabilizer 108 can include the stabilizer bar formed between the redistribution layer 104 and the side rail 106.

The stabilizer bar is formed from a portion of the leadframe 102. The stabilizer bar can extend inward from the side rail 106 and span from the side rail 106 to the encapsulation 112. The stabilizer bar can reduce the warpage of the leadframe system 100 during heating operations such as reflow operations.

The stabilizer bar can be formed in a variety of shape. For example, the stabilizer bar can have a strip shape and extend substantially along one side of the side rail 106. In another example, the stabilizer 108 can include the stabilizer bar having one or more elongated segments extending along portions of the side rail 106. The stabilizer bar can be longer in the direction along the side rail 106 and shorter along the direction perpendicular to the side rail 106.

The stabilizer 108 can include the stabilizer plating layer 215 of FIG. 2, such as the bar plating layer, on the bottom side of the stabilizer 108 facing away from the encapsulation 112. The stabilizer plating layer 215 can be formed from a metal, an alloy, a conductive material, or a combination thereof.

The stabilizer 108 and the side rail 106 can be combined to increase the stiffness of the leadframe system 100. The stabilizer 108 can couple together with the stabilizer 108 to distribute mechanical stress and reduce warpage during manufacture.

The stabilizer 108, the side rail 106, and the mold step 202 can combine to increase the stiffness of the leadframe system 100. Forming the mold step 202 over a portion of the stabilizer 108 and directly on the side of the side rail 106 can coupled can distribute mechanical stress across the leadframe system 100 and reduce warpage during manufacture.

The stabilizer 108 and the mold step 202 can form the stiffening structure 203 to reduce warpage of the leadframe system 100. The stiffening structure 203 is a layered structural element. The stiffening structure 203 can include multiple layers for resisting mechanical stress and reducing warpage. The stiffening structure 203 can also include the stabilizer plating layer 215, the encapsulation 112, or a combination thereof. For example, the stiffening structure 203 can be formed with the stabilizer bar, the mold step 202, and the stabilizer plating layer 215.

It has been discovered that forming the stiffening structure 203 of FIG. 2 with the mold step 202 and the stabilizer bar increases reliability and increases manufacturing yield by reducing the amount of warpage during the manufacturing of the leadframe system 100. The stiffening structure 203 provides a layered structure for reducing warpage by allowing the dissipation of mechanical stress and providing rigidity to the leadframe system 100.

It has been discovered that forming the top rail coating 206 and the bottom rail coating 208 increases reliability and increases manufacturing yield by reducing the amount of warpage due to the side rail 106 during heating. The top rail coating 206 and the bottom rail coating 208 on the side rail 106 increase the stiffness of the side rail 106, allowing the side rail 106 to be thinner to reduce the amount of warpage due to the side rail 106.

It has been discovered that forming the mold step 202 between the encapsulation 112 and the side rail 106 increases reliability by reducing warpage of the leadframe 102. Because the mold step 202 deforms less than the side rail 106 when heated, the mold step 202 reduces the degree of warpage caused by heating the side rail 106 during reflow operations.

It has been discovered that forming the encapsulation 112 and the mold step 202 increases reliability and reduces complexity by forming the mold step 202 as part of the encapsulation 112. By forming the encapsulation 112 and the mold step 202 in one operation, the degree of warpage caused by heating the side rail 106 during reflow operations can be reduced with fewer manufacturing steps.

Figure 8:
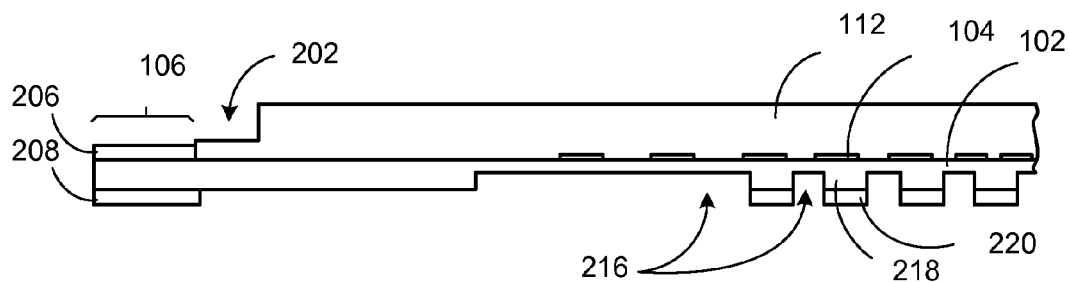
FIG. 8 is an exemplary side view of a portion of the leadframe system along a line 8-8 of FIG. 6.

Referring now to FIG. 8, therein is shown an exemplary side view of a portion of the leadframe system 100 of FIG. 6 along a line 8-8 of FIG. 6. The leadframe system 100 can include the leadframe 102, the redistribution layer 104, the encapsulation 112, the mold step 202, the stabilizer 108 of FIG. 1, and the side rail 106.

The leadframe 102 is a metallic structural element for forming an integrated circuit packaging system. The leadframe 102 can be formed from metal, alloy, or another conductive structural material. For example, the leadframe 102 can be formed from copper.

The redistribution layer 104 is a conductive structure for forming conductive paths. The redistribution layer 104 can include traces, pads, vias, or a combination thereof. The redistribution layer 104 can be formed directly on a portion of the leadframe 102.

The redistribution layer 104 can be formed directly on the leadframe 102. For example, the traces of the redistribution layer 104 can be formed by etching a planar layer of conductive material formed directly on top of the leadframe 102.

The encapsulation 112 can be formed directly on the leadframe 102 and the redistribution layer 104. The encapsulation 112 is a non-conductive layer for protecting underlying elements. For example, the encapsulation 112 can be formed with an encapsulation molding compound.

The encapsulation 112 can be formed directly on and over the redistribution layer 104. The encapsulation 112 can encapsulate the redistribution layer 104 and expose the redistribution layer 104 to the leadframe 102.

The leadframe system 100 can include the mold step 202. The mold step is a lowered structural element extending outward from the encapsulation 112. The mold step 202 can be formed from the encapsulation molding compound. The mold step 202 can be between the encapsulation 112 and the side rail 106. The mold step 202 can add stiffness to the integrated packaging system by extending the encapsulation 112 to the edge of the side rail 106.

The leadframe system 100 can include the side rail 106. The side rail 106 is a structural element located around the perimeter of the leadframe 102. The side rail 106 can be formed from a portion of the leadframe 102.

The side rail 106 can include the top rail coating 206 and the bottom rail coating 208. The top rail coating 206 and the bottom rail coating 208 are conductive structures formed on the leadframe 102.

The top rail coating 206 and the bottom rail coating 208 can be metal, alloy, or a combination thereof. Although the top rail coating 206 and the bottom rail coating 208 are shown as a single layer, it is understood that the top rail coating 206 and the bottom rail coating 208 can be multi-layer structures.

The top rail coating 206 and the bottom rail coating 208 can be formed from an etch resistant material. For example, portions of the leadframe 102 having the top rail coating 206 and the bottom rail coating 208 can be protected from etching.

The top rail coating 206 is on the same side of the leadframe system 100 as the encapsulation 112. The bottom rail coating 208 is on the side opposite from the encapsulation 112.

The side rail 106 can include the rail top side 204 of FIG. 2 and the rail bottom side 210 of FIG. 2. The rail top side 204 is on the same side as the encapsulation 112 and the top rail coating 206. The rail bottom side 210 is on the opposite side from the rail top side 204 and on the same side as the bottom rail coating 208.

The leadframe system 100 can include the vertical interconnects 218. The vertical interconnects 218 are electrically conductive structures. The vertical interconnects 218 can be electrically connected to the redistribution layer 104.

The vertical interconnects 218 can include the interconnect coating layer 220. The interconnect coating layer 220 is a conductive protection layer on the bottom side of the vertical interconnect 218. The interconnect coating layer 220 can be formed from a metal, an alloy, or a combination thereof.

The interconnect coating layer 220 can be an etch resistant material. For example, portions of the leadframe 102 having the interconnect coating layer 220 can be protected from etching.

The leadframe 102 can include the half-etched area 216. The half-etched area 216 is a portion of the leadframe 102 that has been partially etched to remove a portion of the leadframe 102 while exposing a lowered portion of the leadframe 102. For example, the half-etched area 216 can be between the vertical interconnects 218 and the side rail 106. In another example, the half-etched area 216 can be between one of the vertical interconnects 218 and another of the vertical interconnects 218.

The leadframe system 100 can include the stabilizer 108, such as the stabilizer bar, a stiffener, or a combination thereof. The stabilizer 108 is a structural element for increasing the stiffness of the leadframe system 100.

The stabilizer 108 can be positioned around the redistribution layer 104 and between the redistribution layer 104 and the side rail 106. For example, the stabilizer 108 can include the stabilizer bar formed between the redistribution layer 104 and the side rail 106.

The stabilizer 108 is formed from a portion of the leadframe 102. The stabilizer 108 can extend inward from the side rail 106 and span from the side rail 106 to the encapsulation 112. The stabilizer 108 can reduce the warpage of the leadframe system 100 during heating operations such as reflow operations.

The stabilizer 108 can be formed in a variety of shape. For example, the stabilizer 108 can be the stabilizer bar having a strip shape and extend substantially along one side of the side rail 106. In another example, the stabilizer 108 can include the stabilizer bar having one or more elongated segments extending along portions of the side rail 106. The stabilizer bar can be longer in the direction along the side rail 106 and shorter along the direction perpendicular to the side rail 106.

The stabilizer 108 can include the stabilizer plating layer 215 of FIG. 2, such as the bar plating layer, on the bottom side of the stabilizer 108 facing away from the encapsulation 112. The stabilizer plating layer 215 can be formed from a metal, an alloy, a conductive material, or a combination thereof.

It has been discovered that forming the stiffening structure 203 of FIG. 2 with the mold step 202 and the stabilizer 108 increases reliability and increases manufacturing yield by reducing the amount of warpage during the manufacturing of the leadframe system 100. The stiffening structure 203 provides a layered structure for reducing warpage by allowing the dissipation of mechanical stress and providing rigidity to the leadframe system 100.

It has been discovered that forming the top rail coating 206 and the bottom rail coating 208 increases reliability and increases manufacturing yield by reducing the amount of warpage due to the side rail 106 during heating. The top rail coating 206 and the bottom rail coating 208 on the side rail 106 increase the stiffness of the side rail 106, allowing the side rail 106 to be thinner to reduce the amount of warpage due to the side rail 106.

It has been discovered that forming the mold step 202 between the encapsulation 112 and the side rail 106 increases reliability by reducing warpage of the leadframe 102. Because the mold step 202 deforms less than the side rail 106 when heated, the mold step 202 reduces the degree of warpage caused by heating the side rail 106 during reflow operations.

It has been discovered that forming the encapsulation 112 and the mold step 202 increases reliability and reduces complexity by forming the mold step 202 as part of the encapsulation 112. By forming the encapsulation 112 and the mold step 202 in one operation, the degree of warpage caused by heating the side rail 106 during reflow operations can be reduced with fewer manufacturing steps.

Figure 9:
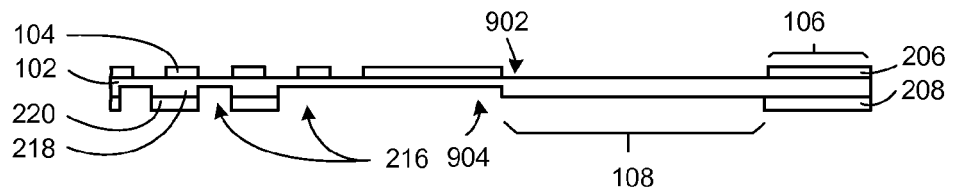
FIG. 9 is a cross-sectional view of a portion of the leadframe system in a preparation phase of manufacture.

Referring now to FIG. 9, therein is shown a cross-sectional view of a portion of the leadframe system 100 of FIG. 1 in a preparation phase of manufacture. The leadframe system 100 can include the leadframe 102 to provide a support structure for forming the leadframe system 100.

The leadframe 102 is a conductive support structure. The leadframe 102 can be provided with other components including the redistribution layer 104, the vertical interconnects 218, and the side rail 106.

The leadframe 102 can include a leadframe active side 902 and a leadframe inactive side 904. The leadframe active side 902 is for mounting active components. The leadframe inactive side 904 is opposite from the leadframe active side 902.

The leadframe 102 can include the redistribution layer 104 formed directly on the leadframe active side 902. The redistribution layer 104 can include traces, bond pads, interconnects, or a combination thereof.

The redistribution layer 104 can be formed by depositing a conductive layer directly on the leadframe active side 902 and removing portions of the conductive layer to form the redistribution layer 104. For example, portions of the conductive layer can be removed by etching over a mask layer to form the redistribution layer 104.

The leadframe 102 can include the side rail 106 having the top rail coating 206 and the bottom rail coating 208. The top rail coating 206 can be formed on the rail top side 204. The bottom rail coating 208 can be formed on the rail bottom side 210.

The top rail coating 206 and the bottom rail coating 208 can be formed in a variety of ways. For example, the top rail coating 206 and the bottom rail coating 208 can be formed by plating, chemical vapor deposition, mechanical application, or a combination thereof.

The leadframe 102 can include the vertical interconnects 218 on the leadframe inactive side 904. The vertical interconnects 218 can form connections with the redistribution layer 104.

The vertical interconnects 218 can include the interconnect coating layer 220 on the bottom side of the vertical interconnects 218. The interconnect coating layer 220 can provide an etch resistant pattern for defining the location of the vertical interconnects 218.

The vertical interconnects 218 can be formed in a variety of ways. For example, the vertical interconnects 218 can be formed by applying the interconnect coating layer 220 in the desired pattern on the leadframe 102 and half etching the leadframe 102 to remove a portion of the unprotected material from the leadframe 102. In another example, the leadframe 102 can be selectively etched to remove the leadframe material around the vertical interconnects 218.

The leadframe 102 can include the half-etched areas 216 on the leadframe inactive side 904 between the vertical interconnects 218. The leadframe 102 can include half-etched areas between the side rail 106 and the vertical interconnects 218. The leadframe 102 can include an uncoated portion between one of the half-etched areas and the side rail 106 for structural support.

The leadframe system 100 can include the stabilizer 108, such as a stabilizer tab, a stiffener, or a combination thereof. The stabilizer 108 can be directly on the side rail 106.

The stabilizer 108 is a structural element for stiffening the leadframe system 100. For example, the stabilizer 108, such as a stabilizer tab, a stabilizer bar, or a combination thereof, can be formed from a portion of the leadframe 102 that has not been etched.

The stabilizer 108 can extend inward from the side rail 106 toward the redistribution layer 104. The stabilizer 108 can extend along a portion of the side rail 106 about as long as the stabilizer 108 extends inward.

The stabilizer 108 and the side rail 106 can be combined to increase the stiffness of the leadframe system 100. The stabilizer 108 can couple together with the stabilizer 108 to distribute mechanical stress and reduce warpage during manufacture.

It has been discovered that forming the top rail coating 206 and the bottom rail coating 208 increases reliability and increase manufacturing yield by reducing the amount of warpage due to the side rail 106 during heating. The top rail coating 206 and the bottom rail coating 208 on the side rail 106 increase the stiffness of the side rail 106, allowing the side rail 106 to be thinner to reduce the amount of warpage due to the side rail 106.

Figure 10:
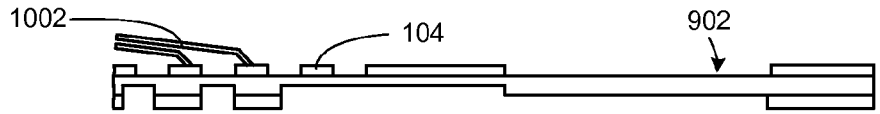
FIG. 10 is the structure of FIG. 9 in an attach phase of manufacturing.

Referring now to FIG. 10, therein is shown the structure of FIG. 9 in an attach phase of manufacturing. The attach phase can include patterning phase can include attaching a die (not shown) to the leadframe system 100 and attaching die interconnects 1002 between the die and the redistribution layer 104.

The die can be attached to the leadframe system 100 in a variety of ways. For example, the die can be attached to the leadframe active side 902 with an adhesive (not shown). In another example, the die can be attached to a die paddle. In yet another example, the die can be a flipchip and the die interconnects 1002 can include bond pads on the side of the flipchip facing the redistribution layer 104.

The die interconnects 1002 can be formed in a variety of ways. For example, the die interconnects 1002 can be formed by attaching bond wires from the die to the redistribution layer 104. In another example, the die interconnects 1002 can be formed using solder balls by attaching a flip chip die to the redistribution layer 104.

Figure 11:
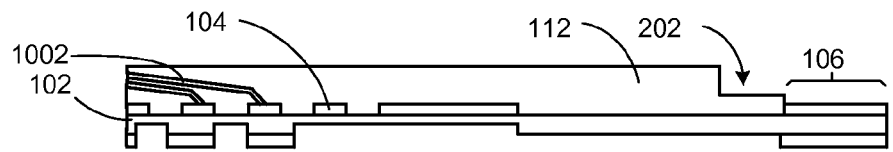
FIG. 11 is the structure of FIG. 10 in a molding phase of manufacturing.

Referring now to FIG. 11, therein is shown the structure of FIG. 10 in a molding phase of manufacturing. The molding phase can include forming the encapsulation 112 directly on the leadframe 102, the redistribution layer 104, the die interconnects 1002, and the side rail 106.

The encapsulation 112 can be formed by applying the encapsulation molding compound directly over the die, the leadframe 102, the redistribution layer 104, the die interconnects 1002, and the side rail 106. The encapsulation 112 is formed within the side rail 106.

Forming the encapsulation 112 can include forming the mold step 202. The mold step 202 is formed between the encapsulation 112 and the side rail 106. The mold step 202 has a lower height than the encapsulation 112. The mold step 202 is formed directly over the stabilizer 108 for forming the stiffening structure 203 of FIG. 2 to reduce warpage.

The encapsulation 112 and the mold step 202 can be formed in a variety of ways. For example, the encapsulation 112 and the mold step 202 can be formed by placing a mold chase (not shown) on the leadframe 102 and injecting encapsulation molding compound. In another example, the encapsulation 112 can be formed on the leadframe 102 and the mold step 202 can be formed by removing a portion of the encapsulation 112 to form a step having a lower height.

It has been discovered that forming the stiffening structure 203 with the mold step 202 and the stabilizer 108 increases reliability and increases manufacturing yield by reducing the amount of warpage during the manufacturing of the leadframe system 100 of FIG. 1. The stiffening structure 203 provides a layered structure for reducing warpage by allowing the dissipation of mechanical stress and providing rigidity to the leadframe system 100.

It has been discovered that forming the mold step 202 between the encapsulation 112 and the side rail 106 increases reliability by reducing warpage of the leadframe 102. Because the mold step 202 deforms less than the side rail 106 when heated, the mold step 202 reduces the degree of warpage caused by heating the side rail 106 during reflow operations.

Figure 12:
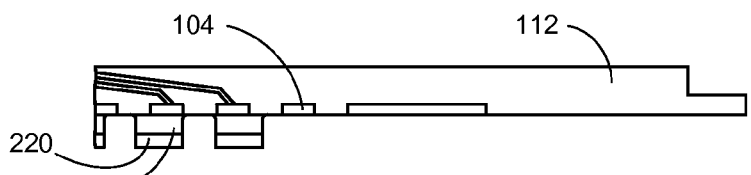
FIG. 12 is the structure of FIG. 11 in a railless etching phase of manufacturing.

Referring now to FIG. 12, therein is shown the structure of FIG. 11 in a railless etching phase of manufacturing. The etching phase can include removing a portion of the leadframe system 100 of FIG. 1.

The railless etching phase can remove the portions of the leadframe 102 that are not protected by the interconnect coating layer 220 and leave the vertical interconnects 218 capped with the interconnect coating layer 220. For example, the railless etching phase can remove the half-etched area 216 of FIG. 2 of the leadframe 102 of FIG. 1.

The leadframe 102 can be etched in a variety of ways. For example, the leadframe 102 can be etching using a chemical etch, ion etch, mechanical grinding, or a combination thereof.

The railless etching phase can expose the bottom side of the encapsulation 112 and the redistribution layer 104. As a result of the etching, the encapsulation 112 and the redistribution layer 104 can have the physical characteristics of etching including an etched surface, pitting, scratches, grooves, irregular surface, or a combination thereof.

The railless etching phase can include removing the side rail 106 of FIG. 1. For example, the side rail 106 can be removed by cutting, grinding, or a combination thereof.

It has been discovered that removing the side rail 106 reliability and increases manufacturing yield by reducing the amount of warpage during thermal operations. Removing the side rail 106 reduces warpage of the leadframe 102 by eliminating the mechanical stresses caused by heating the side rail 106 during reflow operations.

Figure 13:
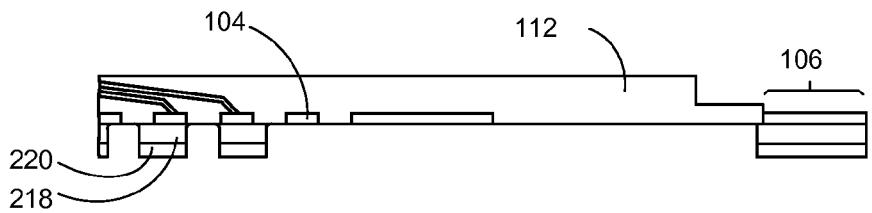
FIG. 13 is the structure of FIG. 11 in a railed etching phase of manufacturing.

Referring now to FIG. 13, therein is shown the structure of FIG. 11 in a railed etching phase of manufacturing. The etching phase can include removing material from the leadframe system 100 of FIG. 1 within the side rail 106.

The railed etching phase can remove the portions of the leadframe 102 of FIG. 1 near the vertical interconnects 218 that are not protected by the interconnect coating layer 220 and leave the vertical interconnects 218 capped with the interconnect coating layer 220. For example, the railed etching phase can remove the half-etched area 216 of FIG. 2 of the leadframe 102.

The railed etching phase can remove the stabilizer 108. The stabilizer 108 can be removed in a variety of ways. For example, the stabilizer 108 can be removed by first removing the stabilizer plating layer 215 of FIG. 2 and then etching the stabilizer 108.

The leadframe 102 can be etched in a variety of ways. For example, the leadframe 102 can be etching using a chemical etch, ion etch, mechanical grinding, or a combination thereof.

The railed etching phase can expose the bottom side of the encapsulation 112 and the redistribution layer 104. As a result of the etching, the encapsulation 112 and the redistribution layer 104 can have the physical characteristics of etching including an etched surface, pitting, scratches, grooves, irregular surface, or a combination thereof.

It has been discovered that removing the stabilizer 108 while keeping the side rail 106 increases reliability and increases manufacturing yield by reducing the amount of warpage. Removing the stabilizer 108 and keeping the side rail 106 reduces warpage of the leadframe 102 by using the side rail 106 to provide support during non-thermal operations.

Figure 14:
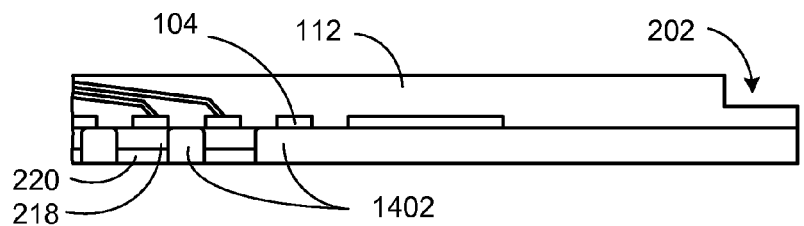
FIG. 14 is the structure of FIG. 12 in a railless protection phase of manufacturing.

Referring now to FIG. 14, therein is shown the structure of FIG. 12 in a railless protection phase of manufacturing. The railless protection phase can include forming a trace protection layer 1402 on the bottom side of the leadframe system 100 of FIG. 1.

The trace protection layer 1402 is an electrically insulating layer for protecting the redistribution layer 104 and the vertical interconnects 218. The trace protection layer 1402 can be formed from a variety of materials such as an epoxy, a resin, a solder resist, or a combination thereof. The trace protection layer 1402 can form a hermetic seal over the redistribution layer 104 and the vertical interconnects 218 to prevent damage by contamination from foreign substances.

The trace protection layer 1402 can be formed in a variety of ways. For example, the trace protection layer 1402 can be formed by attaching a mold chase (not shown) to the leadframe system 100 and injecting a liquid epoxy or resin into the mold chase. In another example, the trace protection layer 1402 can be applied to the bottom surface of the leadframe system 100 as a protection tape.

The trace protection layer 1402 can be formed directly on the vertical interconnects, a portion of the interconnect coating layer 220, the encapsulation 112, the mold step 202, and the redistribution layer 104. The trace protection layer 1402 can expose the bottom of the interconnect coating layer 220 to allow electrical connections to the vertical interconnects 218 and the redistribution layer 104.

The trace protection layer 1402 can extend along the entirety of the bottom side of the leadframe system 100. The trace protection layer 1402 can be formed directly on the mold step 202 to reinforce and provide additional stiffness to the mold step 202 and the edges of the leadframe system 100.

The trace protection layer 1402 can be formed from a variety of materials. For example, the trace protection layer 1402 can be made from materials such as epoxy molding compound, liquid molding compound, curable underfill, film lamination, or other moldable compound.

It has been discovered that forming the trace protection layer 1402 increases reliability and reduces short circuits by protecting the redistribution layer 104 and isolating the vertical interconnects 218. Providing electrical insulation and mechanical protection by forming the trace protection layer 1402 increases the manufacturing yield by protecting the redistribution layer 104 and the vertical interconnects 218.

Figure 15:
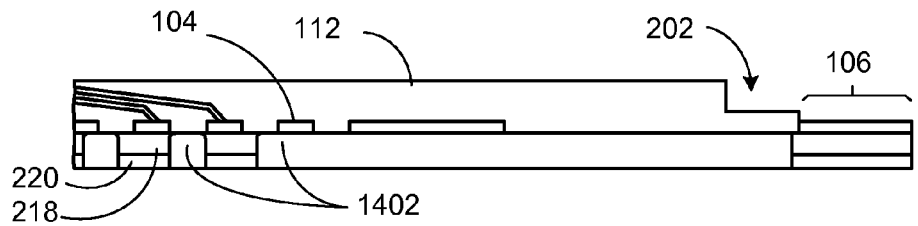
FIG. 15 is the structure of FIG. 13 in a railed protection phase of manufacturing.

Referring now to FIG. 15, therein is shown the structure of FIG. 13 in a railed protection phase of manufacturing. The railed protection phase can include forming the trace protection layer 1402 on the bottom side of the leadframe system 100 of FIG. 1 with the side rail 106 attached.

The trace protection layer 1402 is an electrically insulating layer for protecting the redistribution layer 104 and the vertical interconnects 218. The trace protection layer 1402 can be formed from a variety of materials such as an epoxy, a resin, a solder resist, or a combination thereof. The trace protection layer 1402 can form a hermetic seal over the redistribution layer 104, the vertical interconnects 218, and a side portion of the side rail 106 to prevent damage by contamination from foreign substances.

The trace protection layer 1402 can be formed in a variety of ways. For example, the trace protection layer 1402 can be formed by attaching a mold chase (not shown) to the leadframe system 100 and injecting a liquid epoxy or resin into the mold chase. In another example, the trace protection layer 1402 can be applied to the bottom surface of the leadframe system 100 as a protection tape.

The trace protection layer 1402 can be formed directly on the vertical interconnects, a portion of the interconnect coating layer 220, the encapsulation 112, the mold step 202, and the redistribution layer 104. The trace protection layer 1402 can expose the bottom of the interconnect coating layer 220 to allow electrical connections to the vertical interconnects 218 and the redistribution layer 104.

The trace protection layer 1402 can extend along the entirety of the bottom side of the leadframe system 100 within the perimeter of the side rail 106. The trace protection layer 1402 can be formed directly on the mold step 202 to reinforce and provide additional stiffness to the mold step 202 and the edges of the leadframe system 100.

The trace protection layer 1402 can be formed from a variety of materials. For example, the trace protection layer 1402 can be made from materials such as epoxy molding compound, liquid molding compound, curable underfill, film lamination, or other moldable compound.

It has been discovered that forming the trace protection layer 1402 increases reliability and reduces short circuits by protecting the redistribution layer 104 and isolating the vertical interconnects 218. Providing electrical insulation and mechanical protection by forming the trace protection layer 1402 increases the manufacturing yield by protecting the redistribution layer 104 and the vertical interconnects 218.

Figure 16:
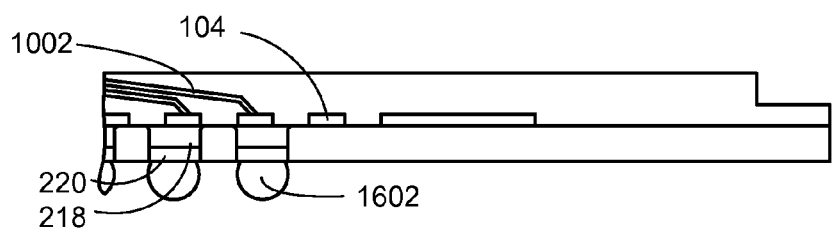
FIG. 16 is the structure of FIG. 14 in a railless external interconnect phase of manufacturing.

Referring now to FIG. 16, therein is shown the structure of FIG. 14 in a railless external interconnect phase of manufacturing. The railless external interconnect phase can include attaching external interconnects 1602 directly on the interconnect coating layer 220. The external interconnects 1602 can be solder balls, solder bumps, columns, or a combination thereof. The external interconnects 1602 can provide an electrically conductive path through the vertical interconnects 218, the redistribution layer 104, and the die interconnects 1002.

The external interconnects 1602 can be formed in a variety of ways. For example, the external interconnects 1602 can be formed by directly applying solder balls to the interconnect coating layer 220 on the vertical interconnect 218. In another example, the external interconnects 1602 can be formed by applying a conductive paste to the interconnect coating layer 220.

Figure 17:
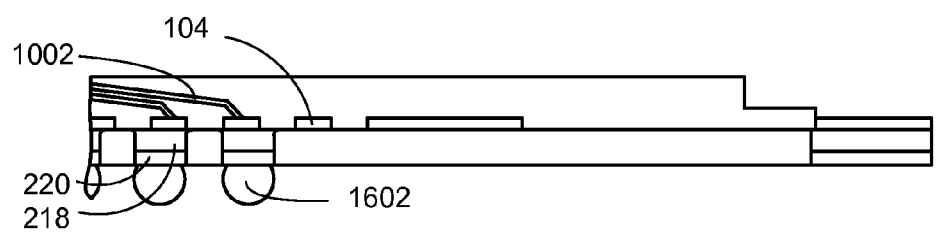
FIG. 17 is the structure of FIG. 15 in a railed external interconnect phase of manufacturing.

Referring now to FIG. 17, therein is shown the structure of FIG. 15 in a railed external interconnect phase of manufacturing. The railed external interconnect phase can include attaching the external interconnects 1602 directly on the interconnect coating layer 220. The external interconnects 1602 can be solder balls, solder bumps, columns, or a combination thereof. The external interconnects 1602 can provide an electrically conductive path through the vertical interconnects 218, the redistribution layer 104, and the die interconnects 1002.

The external interconnects 1602 can be formed in a variety of ways. For example, the external interconnects 1602 can be formed by directly applying solder balls to the interconnect coating layer 220 on the vertical interconnect 218. In another example, the external interconnects 1602 can be formed by applying a conductive paste to the interconnect coating layer 220.

Figure 18:
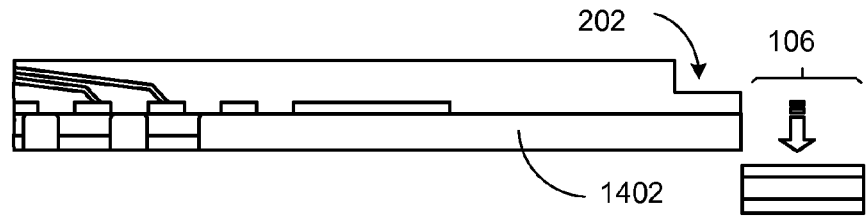
FIG. 18 is the structure of FIG. 17 in a rail removal phase of manufacturing.

Referring now to FIG. 18, therein is shown the structure of FIG. 17 in a rail removal phase of manufacturing. The rail removal phase can include removing the side rail 106 from the leadframe system 100 of FIG. 1.

The side rail 106 can be removed in a variety of ways. For example, the side rail 106 can be removed by cutting, grinding, or a combination thereof. Removing the side rail 106 can expose the side of the mold step 202 and the side of the trace protection layer 1402.

Removing the side rail 106 can provide the non-horizontal side of the mold step 202 and the non-horizontal side of the trace protection layer 1402 with the physical characteristics of removal including an etched surface, pitting, scratches, grooves, irregular surface, or a combination thereof.

It has been discovered that removing the side rail 106 increases reliability and increases manufacturing yield by reducing the amount of warpage during thermal operations. Removing the side rail 106 reduces warpage of the leadframe system 100 by eliminating the mechanical stresses caused by heating the side rail 106 during reflow operations.

Figure 19:
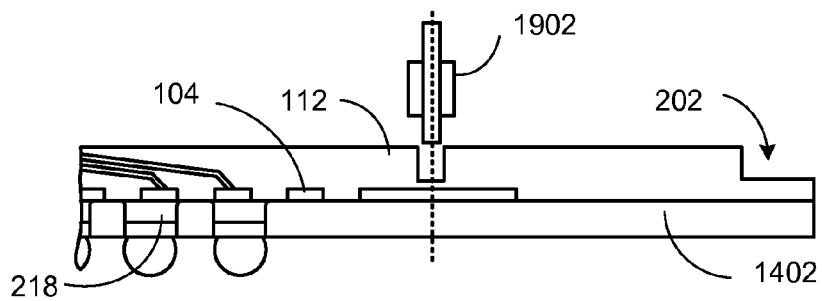
FIG. 19 is the structure of FIG. 16 in a railless singulation phase of manufacturing.

Referring now to FIG. 19, therein is shown the structure of FIG. 16 in a railless singulation phase of manufacturing. The railless singulation phase can include singulating the leadframe system 100 of FIG. 1 by cutting the leadframe system 100 through a line located between the vertical interconnects 218 and the mold step 202.

For example, the leadframe system 100 can be singulated by cutting at a line through a portion of the redistribution layer 104 to separate the leadframe system 100 in two parts. In another example, the leadframe system 100 can be singulated by cutting at a line between the redistribution layer 104 and the mold step 202.

The leadframe system 100 can be singulated in a variety of ways. For example, the leadframe system 100 can be etching, cut, ground, routed, laser cut, or a combination thereof. In another example, the leadframe system 100 can be cut with a blade 1902.

Singulating the leadframe system 100 can provide the non-horizontal side of the encapsulation 112 and the non-horizontal side of the trace protection layer 1402 with the physical characteristics of singulation including an etched surface, pitting, scratches, grooves, irregular surface, or a combination thereof.

Figure 20:
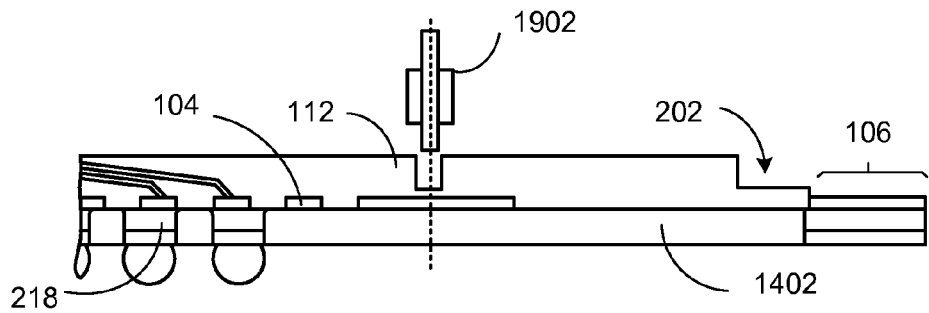
FIG. 20 is the structure of FIG. 17 in a railed singulation phase of manufacturing.

Referring now to FIG. 20, therein is shown the structure of FIG. 17 in a railed singulation phase of manufacturing. The railed singulation phase can include singulating the leadframe system 100 of FIG. 1 by cutting the leadframe system 100 through a line located between the vertical interconnects 218 and the side rail 106.

For example, the leadframe system 100 can be singulated by cutting at a line through a portion of the redistribution layer 104. In another example, the leadframe system 100 can be singulated by cutting at a line between the redistribution layer 104 and the mold step 202.

The leadframe system 100 can be singulated in a variety of ways. For example, the leadframe system 100 can be etching, cut, ground, routed, laser cut, or a combination thereof. In another example, the leadframe system 100 can be cut with the blade 1902.

Singulating the leadframe system 100 can provide the non-horizontal side of the encapsulation 112 and the non-horizontal side of the trace protection layer 1402 with the physical characteristics of singulation including an etched surface, pitting, scratches, grooves, irregular surface, or a combination thereof.

Figure 21:
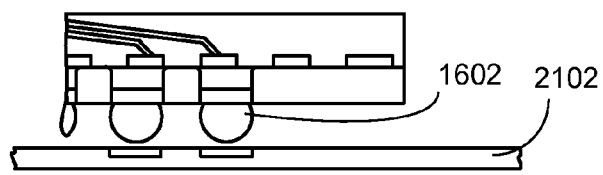
FIG. 21 is a portion of the leadframe system in a mounting phase of manufacturing.

Referring now to FIG. 21, therein is shown a portion of the leadframe system 100 in a mounting phase of manufacturing. The mounting phase can include attaching the leadframe system 100 to an external system 2102. The leadframe system 100 can be attached to the external system by connecting the external interconnects 1602 to the external system and performing a reflow operation to melt the external interconnects 1602 to form electrical connections with the external system 2102

Figure 22:
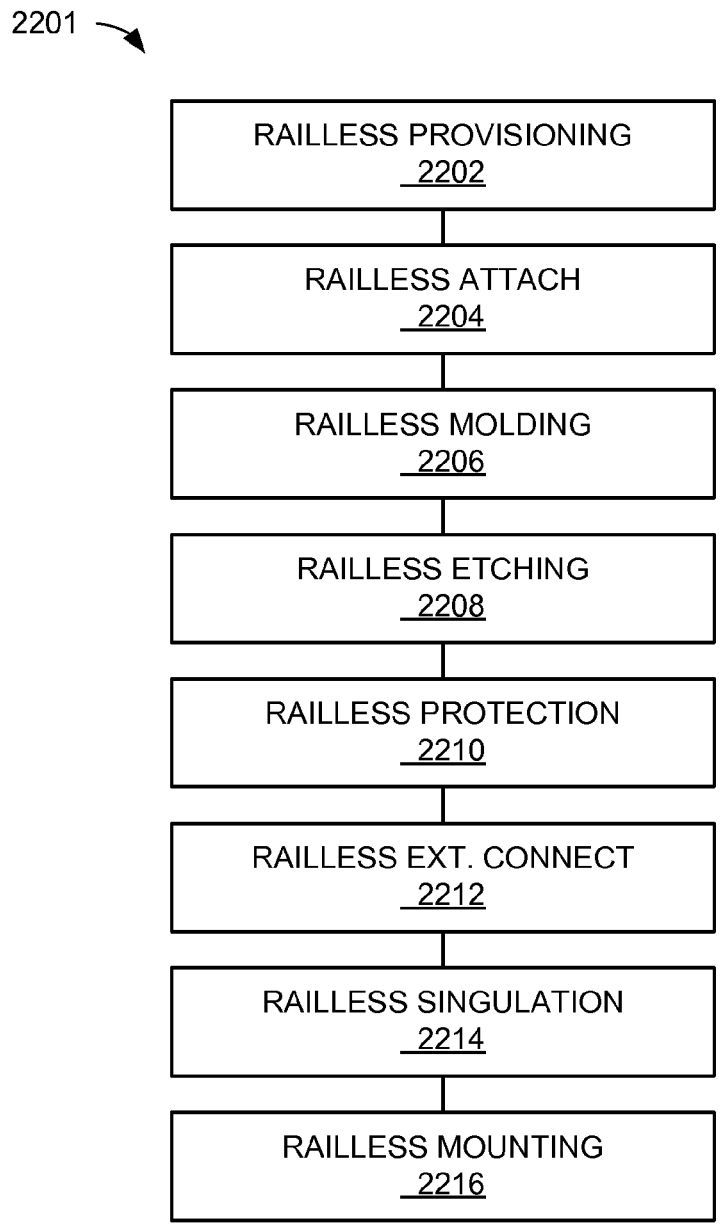
FIG. 22 is a railless process flow 2201 for manufacturing the leadframe system.

Referring now to FIG. 22, therein is shown a railless process flow 2201 for manufacturing the leadframe system 100 of FIG. 1. The railless process flow 2201 can include a railless provisioning step 2202, a railless attach step 2204, a railless molding step 2206, a railless etching step 2208, a railless protection step 2210, a railless external connect step 2212, a railless singulation step 2214, and a railless mounting step 2216.

In the railless provisioning step 2202, the leadframe 102 of FIG. 1 can be provided as illustrated in FIG. 9. The leadframe 102 can be provided with the redistribution layer 104 of FIG. 1, the vertical interconnects 218 of FIG. 2, and the side rail 106 of FIG. 1.

In the railless attach step 2204, the die interconnects 1002 of FIG. 10 can be attached between the die (not shown) and the redistribution layer 104 as shown in FIG. 10. The die interconnects 1002 can provide electrically conductive paths to from the die to the redistribution layer 104 and an external system (not shown).

In the railless molding step 2206, the encapsulation 112 of FIG. 1 can form an electrically insulating protection layer directly on the die (not shown), the leadframe 102, the die interconnects 1002, and the redistribution layer 104 as shown in FIG. 11. The encapsulation 112 can include the mold step 202 of FIG. 2 formed between the encapsulation 112 and the side rail 106.

In the railless etching step 2208, the leadframe system 100 can be etched to remove material as shown in FIG. 12. The leadframe system 100 can be etched to remove portions of the leadframe 102 to form the vertical interconnects 218.

In the railless protection step 2210, the trace protection layer 1402 of FIG. 14 can be formed as shown in FIG. 14. The trace protection layer 1402 can be formed directly on the vertical interconnects 218, the redistribution layer 104, the encapsulation 112, and the mold step 202.

In the railless external connect step 2212, the external interconnects 1602 of FIG. 16 can be formed as shown in FIG. 16. The external interconnects 1602 can be formed directly on the interconnect coating layer 220 of FIG. 2 of the vertical interconnects 218.

In the railless singulation step 2214, the leadframe system 100 can be singulated as shown in FIG. 19. The leadframe system 100 can be singulated by cutting the leadframe system 100 through the encapsulation 112, the redistribution layer 104, and the trace protection layer 1402.

In the railless mounting step 2216, the leadframe system 100 can be mounted on an external system as shown in FIG. 21. The leadframe system 100 can be mounted on the external system by attaching the external interconnects 1602 to the external system.

Figure 23:
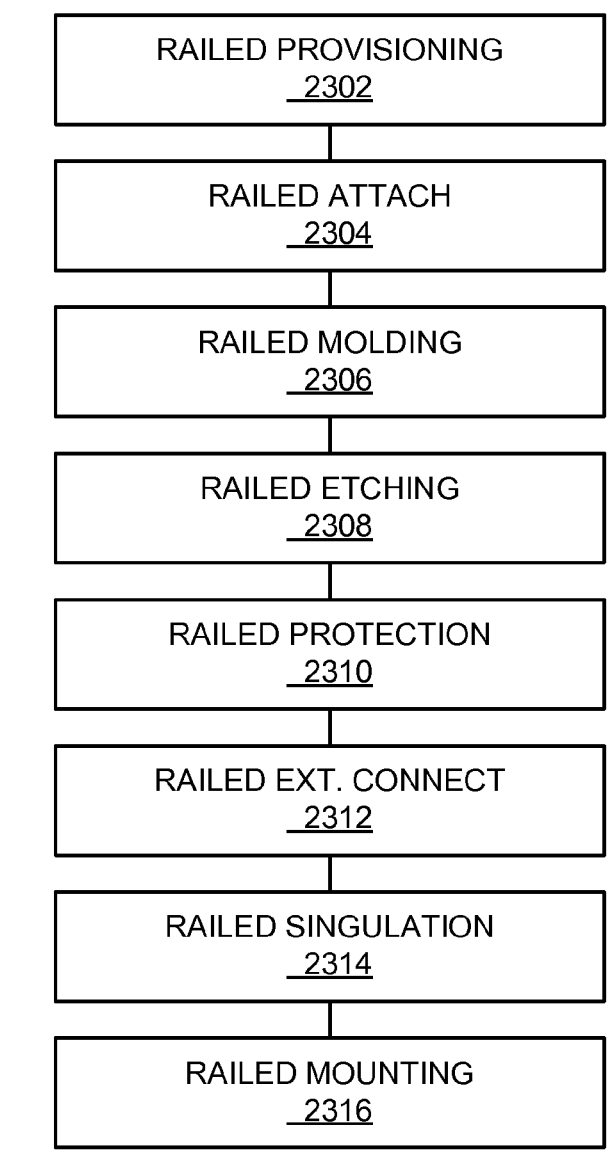
FIG. 23 is a railed process flow 2301 for manufacturing the leadframe system.

Referring now to FIG. 23, therein is shown a railed process flow 2301 for manufacturing the leadframe system 100 of FIG. 1. The railed process flow 2301 can include a railed provisioning step 2302, a railed attach step 2304, a railed molding step 2306, a railed etching step 2308, a railed protection step 2310, a railed external connect step 2312, a railed singulation step 2314, and a railed mounting step 2316.

In the railed provisioning step 2302, the leadframe 102 of FIG. 1 can be provided as illustrated in FIG. 9. The leadframe 102 can be provided with the redistribution layer 104 of FIG. 1, the vertical interconnects 218 of FIG. 2, and the side rail 106 of FIG. 1.

In the railed attach step 2304, the die interconnects 1002 of FIG. 10 can be attached between the die (not shown) and the redistribution layer 104 as shown in FIG. 10. The die interconnects 1002 can provide electrically conductive paths to from the die to the redistribution layer 104 and an external system (not shown).

In the railed molding step 2306, the encapsulation 112 of FIG. 1 can form an electrically insulating protection layer directly on the die (not shown), the leadframe 102, the die interconnects 1002, and the redistribution layer 104 as shown in FIG. 11. The encapsulation 112 can include the mold step 202 of FIG. 2 formed between the encapsulation 112 and the side rail 106.

In the railed etching step 2308, the leadframe system 100 of FIG. 1 can be etched to remove material as shown in FIG. 13. The leadframe system 100 can be etched to remove portions of the leadframe 102 to form the vertical interconnects 218.

In the railed protection step 2310, the trace protection layer 1402 of FIG. 14 can be formed as shown in FIG. 15. The trace protection layer 1402 can be formed directly on the vertical interconnects 218, the redistribution layer 104, the encapsulation 112, and the mold step 202.

In the railed external connect step 2312, the external interconnects 1602 of FIG. 16 can be formed as shown in FIG. 17. The external interconnects 1602 can be formed directly on the interconnect coating layer 220 of FIG. 2 of the vertical interconnects 218.

In the railed singulation step 2314, the leadframe system 100 can be singulated as shown in FIG. 20. The leadframe system 100 can be singulated by cutting the leadframe system 100 through the encapsulation 112, the redistribution layer 104, and the trace protection layer 1402.

In the railed mounting step 2316, the leadframe system 100 can be mounted on an external system as shown in FIG. 21. The leadframe system 100 can be mounted on the external system by attaching the external interconnects 1602 to the external system.

Figure 24:
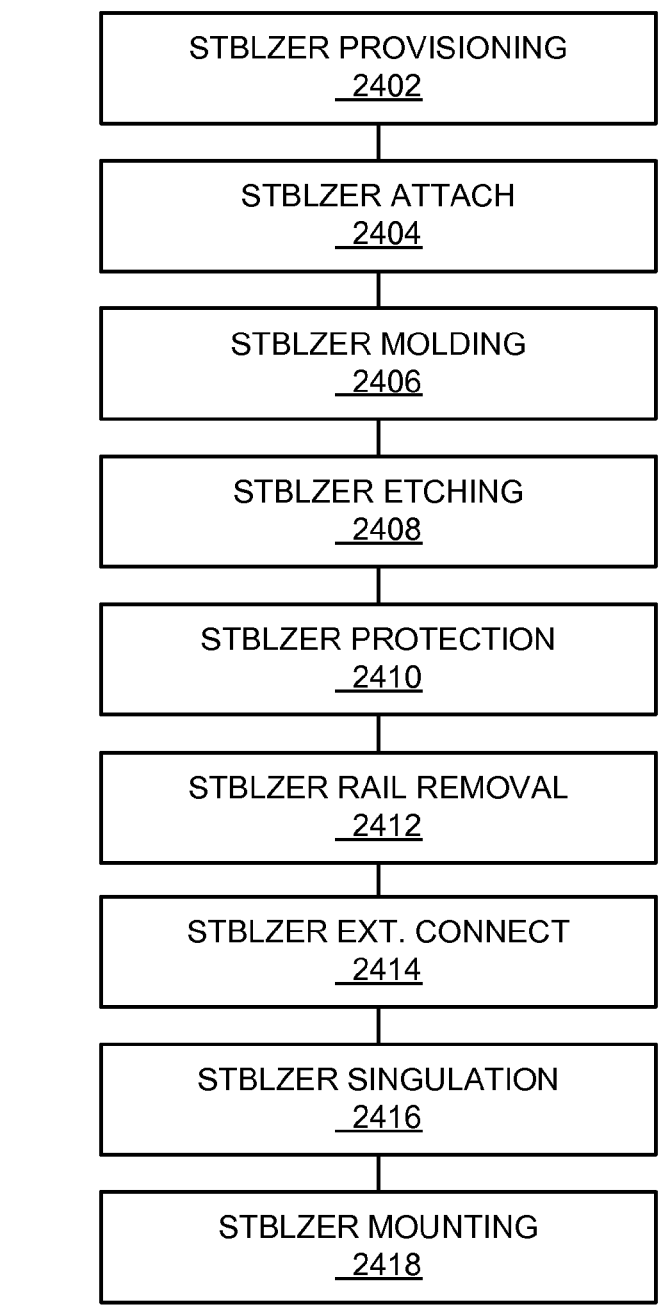
FIG. 24 is a stabilizer process flow 2401 for manufacturing the leadframe system.

Referring now to FIG. 24, therein is shown a stabilizer process flow 2401 for manufacturing the leadframe system 600 of FIG. 6. The stabilizer process flow 2401 can include a stabilizer provisioning step 2402, a stabilizer attach step 2404, a stabilizer molding step 2406, a stabilizer etching step 2408, a stabilizer protection step 2410, a stabilizer rail removal step 2412, a stabilizer external connect step 2414, a stabilizer singulation step 2416, and a stabilizer mounting step 2418.

In the stabilizer provisioning step 2402, the leadframe 102 of FIG. 1 can be provided as illustrated in FIG. 9. The leadframe 102 can be provided with the redistribution layer 104 of FIG. 1, the vertical interconnects 218 of FIG. 2, and the side rail 106 of FIG. 1.

In the stabilizer attach step 2404, the die interconnects 1002 of FIG. 10 can be attached between the die (not shown) and the redistribution layer 104 as shown in FIG. 10. The die interconnects 1002 can provide electrically conductive paths to from the die to the redistribution layer 104 and an external system (not shown).

In the stabilizer molding step 2406, the encapsulation 112 of FIG. 1 can form an electrically insulating protection layer directly on the die (not shown), the leadframe 102, the die interconnects 1002, and the redistribution layer 104 as shown in FIG. 11. The encapsulation 112 can include the mold step 202 of FIG. 2 formed between the encapsulation 112 and the side rail 106.

In the stabilizer etching step 2408, the leadframe system 100 of FIG. 1 can be etched to remove material as shown in FIG. 13. The leadframe system 100 can be etched to remove portions of the leadframe 102 to form the vertical interconnects 218.

In the stabilizer protection step 2410, the trace protection layer 1402 of FIG. 14 can be formed as shown in FIG. 15. The trace protection layer 1402 can be formed directly on the vertical interconnects 218, the redistribution layer 104, the encapsulation 112, and the mold step 202.

In the stabilizer rail removal step 2412, the side rail 106 can be removed as shown in FIG. 18. The external interconnects 1602 of FIG. 16 can be formed directly on the interconnect coating layer 220 of FIG. 2 of the vertical interconnects 218.

In the stabilizer external connect step 2414, the external interconnects 1602 can be formed as shown in FIG. 17. The external interconnects 1602 can be formed directly on the interconnect coating layer 220 of the vertical interconnects 218.

In the stabilizer singulation step 2416, the leadframe system 100 can be singulated as shown in FIG. 20. The leadframe system 100 can be singulated by cutting the leadframe system 100 through the encapsulation 112, the redistribution layer 104, and the trace protection layer 1402.

In the stabilizer mounting step 2418, the leadframe system 100 can be mounted on an external system as shown in FIG. 21. The leadframe system 100 can be mounted on the external system by attaching the external interconnects 1602 to the external system.

Figure 25:
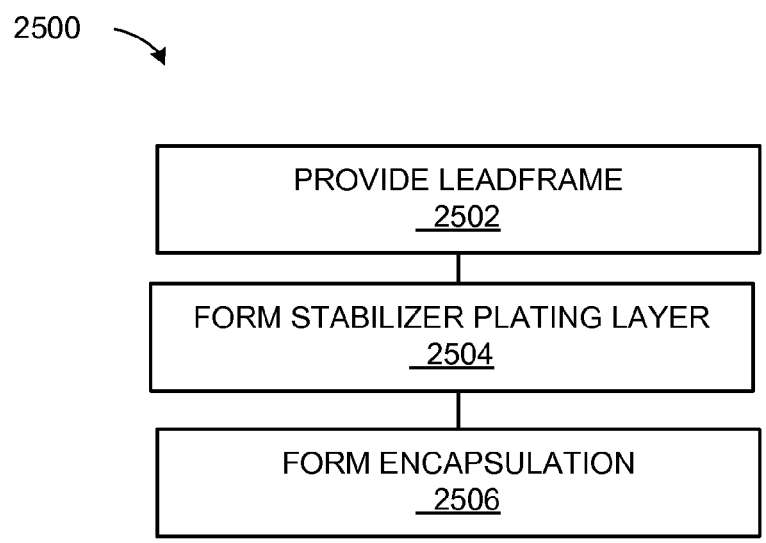
FIG. 25 is a flow chart of a method 2500 of manufacture of the leadframe system in a further embodiment of the present invention.

Referring now to FIG. 25, therein is shown a flow chart of a method 2500 of manufacture of the leadframe system 100 of FIG. 1 in a further embodiment of the present invention. The method 2500 includes: providing a leadframe having a side rail and a stabilizer, the side rail along a leadframe perimeter and the stabilizer within a rail inner perimeter of the side rail in a block 2502; forming a stabilizer plating layer directly on a bottom side of the stabilizer in a block 2504; and forming an encapsulation surrounded by a mold step, the mold step directly over the stabilizer for forming a stiffening structure positioned within the rail inner perimeter of the side rail in a block 2506.

Thus, it has been discovered that the leadframe system of the present invention furnishes important and heretofore unknown and unavailable solutions, capabilities, and functional aspects for a leadframe system. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing leadframe systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of a leadframe system comprising:
   providing a leadframe having a side rail and a stabilizer, the side rail along a leadframe perimeter and the stabilizer within a rail inner perimeter of the side rail;
   forming a stabilizer plating layer directly on a bottom side of the stabilizer; and
   forming an encapsulation having a mold step surrounding a protruding portion of the encapsulation and the mold step directly over the stabilizer for forming a stiffening structure positioned within the rail inner perimeter of the side rail.

2. The method as claimed in claim 1 wherein providing the leadframe includes forming the stabilizer as a stabilizer tab at the side rail.

3. The method as claimed in claim 1 wherein providing the leadframe includes forming the stabilizer as a stabilizer bar along the side rail.

4. The method as claimed in claim 1 wherein forming the encapsulation includes forming the mold step having a lower height than the encapsulation.

5. The method as claimed in claim 1 further comprising:
   removing the side rail and the stabilizer for exposing a bottom side of the encapsulation and the mold step; and
   forming a trace protection layer directly on the bottom side of the encapsulation and the mold step.

6. A method of manufacture of a leadframe system comprising:
   providing a leadframe having a side rail and a stabilizer, the side rail along a leadframe perimeter and the stabilizer within a rail inner perimeter of the side rail;
   forming a redistribution layer on the leadframe;
   attaching a die interconnect to the redistribution layer;
   forming an encapsulation directly on the leadframe, the redistribution layer, and the die interconnect with a protruding portion of the encapsulation surrounded by a mold step of the encapsulation and the mold step directly over the stabilizer and a stabilizer plating layer for forming a stiffening structure positioned within the rail inner perimeter of the side rail; and
   forming a trace protection layer directly on a bottom side of the encapsulation and the mold step.

7. The method as claimed in claim 6 further comprising:
   forming a vertical interconnect on a bottom side of the leadframe;
   forming a trace protection layer directly on the redistribution layer and the vertical interconnect; and
   attaching an external interconnect to the vertical interconnect for connecting to an external system.

8. The method as claimed in claim 6 wherein forming the trace protection layer includes:
   removing a half-etched area of the leadframe for separating a vertical interconnect from another vertical interconnect;
   removing the stabilizer for exposing the bottom side of the encapsulation and the mold step; and
   forming the trace protection layer directly on the bottom side of the encapsulation and the bottom side of the mold step.

9. The method as claimed in claim 6 wherein providing the leadframe includes forming the side rail having a top rail coating and a bottom rail coating.

10. The method as claimed in claim 6 wherein forming the encapsulation includes forming the stiffening structure with the encapsulation and the mold step directly over the stabilizer and the stabilizer plating layer for reducing warpage.

11. A leadframe system comprising:
a leadframe having a leadframe perimeter;
a side rail along the leadframe perimeter;
a stabilizer within a rail inner perimeter of the side rail;
an stabilizer plating layer directly on a bottom side of the stabilizer; and
an encapsulation having a mold step surrounding the encapsulation, the mold step directly over the stabilizer for forming a stiffening structure positioned within the rail inner perimeter of the side rail.

12. The system as claimed in claim 11 wherein the stabilizer is a stabilizer tab at the side rail.

13. The system as claimed in claim 11 wherein the stabilizer is a stabilizer bar along the side rail.

14. The system as claimed in claim 11 wherein the mold step has a lower height than the encapsulation.

15. The system as claimed in claim 11 further comprising:
a bottom side of the encapsulation and the mold step exposed by removing the side rail and the stabilizer; and
a trace protection layer directly on the bottom side of the encapsulation and the mold step.

16. The system as claimed in claim 11 further comprising:
a redistribution layer directly on the leadframe;
a die interconnect attached to the redistribution layer; and
the encapsulation directly on the leadframe, the redistribution layer, and the die interconnect with the mold step surrounding the protruding portion of the encapsulation.

17. The system as claimed in claim 16 further comprising:
a vertical interconnect on a bottom side of the leadframe;
the trace protection layer directly on the redistribution layer and the vertical interconnects; and
external interconnects attached to the vertical interconnect for connecting to an external system.

18. The system as claimed in claim 16 further comprising:
a vertical interconnect directly on the encapsulation; and
wherein:
the trace protection layer is directly on the vertical interconnect, a bottom side of the encapsulation, and a bottom side of the mold step.

19. The system as claimed in claim 16 wherein the side rail includes a top rail coating on a rail top side and a bottom rail coating on a rail bottom side.

20. The system as claimed in claim 16 further comprising a stiffening structure including the encapsulation and the mold step within the leadframe perimeter for reducing warpage.

* * * * *

UNITED STATES PATENT AND TRADEMARK OFFICE
CERTIFICATE OF CORRECTION

| | | |
|---|---|---|
| PATENT NO. | : 9,123,712 B1 | Page 1 of 1 |
| APPLICATION NO. | : 13/949432 | |
| DATED | : September 1, 2015 | |
| INVENTOR(S) | : Do et al. | |

It is certified that error appears in the above-identified patent and that said Letters Patent is hereby corrected as shown below:

In the Specification:

1. Column 9, line 39, delete "surround ng" and insert therefor
   --surround a protruding--

In the Claims:

2. Column 27, Claim 11, line 7, delete "surrounding the" and insert therefor
   --surrounding a protruding portion of the--

3. Column 28, Claim 20, line 22, delete "the leadfrarne" and insert therefor
   --the leadframe--

Signed and Sealed this
Twenty-second Day of March, 2016

Michelle K. Lee
*Director of the United States Patent and Trademark Office*